United States Patent
Wang et al.

(10) Patent No.: US 12,125,546 B2
(45) Date of Patent: Oct. 22, 2024

(54) SHIFT REGISTER AND DRIVING METHOD THEREFOR, GATE DRIVER CIRCUIT, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhu Wang, Beijing (CN); Ling Shi, Beijing (CN); Ke Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/913,617

(22) PCT Filed: Oct. 28, 2021

(86) PCT No.: PCT/CN2021/127180
§ 371 (c)(1),
(2) Date: Sep. 22, 2022

(87) PCT Pub. No.: WO2022/222408
PCT Pub. Date: Oct. 27, 2022

(65) Prior Publication Data
US 2024/0221850 A1    Jul. 4, 2024

(30) Foreign Application Priority Data
Apr. 22, 2021  (CN) .......................... 202110437301.0

(51) Int. Cl.
*G11C 19/28*    (2006.01)
*G09G 3/32*    (2016.01)
(Continued)

(52) U.S. Cl.
CPC ............... *G11C 19/28* (2013.01); *G09G 3/32* (2013.01); *G09G 3/3266* (2013.01);
(Continued)

(58) Field of Classification Search
CPC ............... G09G 3/3266; G09G 3/3677; G09G 2310/0286; G11C 19/28
See application file for complete search history.

(56) References Cited

U.S. PATENT DOCUMENTS 11,217,162 B2 * 1/2022  Han ...................... G09G 3/3233
11,900,883 B2 * 2/2024  Shang .................. G09G 3/3266
(Continued)

FOREIGN PATENT DOCUMENTS

CN    108288460 A    7/2018
CN    110164352 A    8/2019
(Continued)

*Primary Examiner* — Patrick O Neill
(74) *Attorney, Agent, or Firm* — IP & T GROUP LLP

(57) ABSTRACT

A shift register includes a first input sub-circuit being configured to transmit an input signal to a first node under control of a first clock signal; a second input sub-circuit being configured to transmit a first voltage signal to a second node under control of the first clock signal; a first control sub-circuit being configured to transmit a second clock signal to a third node under control of a voltage at the second node; a second control sub-circuit being configured to transmit the first voltage signal to a fourth node under control of a third clock signal; a noise reduction sub-circuit being configured to transmit the first voltage signal to a signal output terminal under control of a voltage at the fourth node; and an output sub-circuit being configured to transmit a second voltage signal to the signal output terminal under control of a voltage at the third node.

20 Claims, 8 Drawing Sheets

(51) Int. Cl.
*G09G 3/3266* (2016.01)
*G09G 3/36* (2006.01)

(52) U.S. Cl.
CPC ... *G09G 3/3677* (2013.01); *G09G 2300/0852* (2013.01); *G09G 2310/0286* (2013.01)

(56) References Cited

U.S. PATENT DOCUMENTS

2019/0333597 A1 10/2019 Liu et al.
2022/0036798 A1* 2/2022 Feng .................... G09G 3/2092
2024/0071312 A1* 2/2024 Shang .................... G11C 19/28

FOREIGN PATENT DOCUMENTS

| | | |
|---|---|---|
| CN | 112150961 A | 12/2020 |
| CN | 112687230 A | 4/2021 |
| CN | 113178221 A | 7/2021 |
| JP | 2010-86637 A | 4/2010 |
| KR | 10-2020-0001285 A | 1/2020 |

\* cited by examiner

SHIFT REGISTER AND DRIVING METHOD THEREFOR, GATE DRIVER CIRCUIT, AND DISPLAY APPARATUS

CROSS-REFERENCE TO RELATED APPLICATIONS

This application is a national phase entry under 35 USC 371 of International Patent Application No. PCT/CN2021/127180, filed on Oct. 28, 2021, which claims priority to Chinese Patent Application No. 202110437301.0, filed on Apr. 22, 2021, which are incorporated herein by reference in their entirety.

TECHNICAL FIELD

The present disclosure relates to the field of display technologies, and in particular, to a shift register and a driving method therefor, a gate driver circuit and a display apparatus.

BACKGROUND

In a pixel driving circuit, a scanning transistor and a reset transistor are turned off most of the time, which require low electric leakage rates, and a switching transistor and a driving transistor are turned on most of the time, which require high charge mobility. Low temperature polycrystalline oxide (LTPO) pixel driving circuits come into being in combination with advantages of both high stability and low production costs of oxide thin film transistors (TFTs) under a low refresh rate and an advantage of high charge mobility of low temperature polysilicon thin film transistors (LTPS-TFTs).

In the LTPO pixel driving circuit, the scanning transistors and the reset transistor adopt N-type oxide TFTs, and the switching transistors and the driving transistor adopt LTPS TFTs. In this way, the high charge mobility, the high stability and high scalability may be achieved at low production costs.

SUMMARY

In an aspect, a shift register is provided. The shift register includes a first input sub-circuit, a second input sub-circuit, a first control sub-circuit, a second control sub-circuit, a noise reduction sub-circuit and an output sub-circuit.

The first input sub-circuit is coupled to a first clock signal terminal, a signal input terminal and a first node. The first input sub-circuit is configured to transmit an input signal from the signal input terminal to the first node under control of a first clock signal from the first clock signal terminal.

The second input sub-circuit is coupled to the first clock signal terminal, a first voltage signal terminal and a second node. The second input sub-circuit is configured to transmit a first voltage signal from the first voltage signal terminal to the second node under control of the first clock signal from the first clock signal terminal.

The first control sub-circuit is coupled to a second clock signal terminal, the second node and a third node. The first control sub-circuit is configured to transmit a second clock signal from the second clock signal terminal to the third node under control of a voltage at the second node.

The second control sub-circuit is coupled to a third clock signal terminal, the first voltage signal terminal and a fourth node. The second control sub-circuit is configured to transmit the first voltage signal from the first voltage signal terminal to the fourth node under control of a third clock signal from the third clock signal terminal.

The noise reduction sub-circuit is coupled to the first voltage signal terminal, the fourth node and a signal output terminal. The noise reduction sub-circuit is configured to transmit the first voltage signal from the first voltage signal terminal to the signal output terminal under control of a voltage at the fourth node.

The output sub-circuit is coupled to a second voltage signal terminal, the third node and the signal output terminal. The output sub-circuit is configured to transmit a second voltage signal from the second voltage signal terminal to the signal output terminal under control of a voltage at the third node.

In some embodiments, the first input sub-circuit is further coupled to the third clock signal terminal and the first voltage signal terminal; and the first input sub-circuit is further configured to transmit the first voltage signal from the first voltage signal terminal to the first node under control of the third clock signal from the third clock signal terminal. The second input sub-circuit is further coupled to the first node; and the second input sub-circuit is further configured to transmit the first clock signal from the first clock signal terminal to the second node under control of a voltage at the first node. The first control sub-circuit is further coupled to the second voltage signal terminal and the first node; and the first control sub-circuit is further configured to transmit the second voltage signal from the second voltage signal terminal to the third node under the control of the voltage at the first node. The second control sub-circuit is further coupled to the second voltage signal terminal and the third node; and the second control sub-circuit is further configured to transmit the second voltage signal from the second voltage signal terminal to the fourth node under the control of the voltage at the third node.

In some embodiments, the first control sub-circuit includes a first pull-down sub-circuit, a pull-up control sub-circuit and a first pull-up sub-circuit. The first pull-down sub-circuit is coupled to the second clock signal terminal, the second node, the third node and a fifth node; and the first pull-down sub-circuit is configured to transmit the second clock signal from the second clock signal terminal to the fifth node and the third node under the control of the voltage at the second node. The pull-up control sub-circuit is coupled to the second voltage signal terminal, the first node and the fifth node; and the pull-up control sub-circuit is configured to transmit the second voltage signal from the second voltage signal terminal to the first node under control of a voltage at the fifth node. The first pull-up sub-circuit is coupled to the second voltage signal terminal, the first node and the third node; and the first pull-up sub-circuit is configured to transmit the second voltage signal from the second voltage signal terminal to the third node under the control of the voltage at the first node.

In some embodiments, the first pull-down sub-circuit includes a first transistor and a second transistor. A control electrode of the first transistor is coupled to the second node, a first electrode of the first transistor is coupled to the second clock signal terminal, and a second electrode of the first transistor is coupled to the fifth node. A control electrode of the second transistor is coupled to the second clock signal terminal, a first electrode of the second transistor is coupled to fifth node, and a second electrode of the second transistor is coupled to the third node. The pull-up control sub-circuit includes one third transistor. A control electrode of the third transistor is coupled to the fifth node, a first electrode of the third transistor is coupled to the second voltage signal terminal, and a second electrode of the third transistor is coupled to the first node. Alternatively, the pull-up control sub-circuit includes at least two third transistors connected in series. Control electrodes of all third transistors in the at least two third transistors connected in series are coupled to the fifth node, a first electrode of a first third transistor in the at least two third transistors connected in series is coupled to the second voltage signal terminal, and a second electrode of a last third transistor in the at least two third transistors connected in series is coupled to the first node. The first pull-up sub-circuit includes a fourth transistor. A control electrode of the fourth transistor is coupled to the first node, a first electrode of the fourth transistor is coupled to the second voltage signal terminal, and a second electrode of the fourth transistor is coupled to the third node.

In some embodiments, the first control sub-circuit includes a first voltage divider sub-circuit, an energy storage sub-circuit, a first pull-down sub-circuit, a second voltage divider sub-circuit, a pull-up control sub-circuit and a first pull-up sub-circuit.

The first voltage divider sub-circuit is coupled to the first voltage signal terminal, the second node and a sixth node. The first voltage divider sub-circuit is configured to transmit the voltage at the second node to the sixth node under control of the first voltage signal from the first voltage signal terminal.

The energy storage sub-circuit is coupled to a fifth node and the sixth node. The energy storage sub-circuit is configured to maintain the voltage at the fifth node and the voltage at the sixth node.

The first pull-down sub-circuit is coupled to the second clock signal terminal, the fifth node, the sixth node and the third node. The first pull-down sub-circuit is configured to transmit the second clock signal from the second clock signal terminal to the fifth node and the third node under control of the voltage at the sixth node.

The second voltage divider sub-circuit is coupled to the first voltage signal terminal, the first node and a seventh node. The second voltage divider sub-circuit is configured to transmit the voltage at the first node to the seventh node under the control of the first voltage signal from the first voltage signal terminal.

The pull-up control sub-circuit is coupled to the second voltage signal terminal, the fifth node and the seventh node. The pull-up control sub-circuit is configured to transmit the second voltage signal from the second voltage signal terminal to the seventh node under control of the voltage at the fifth node.

The first pull-up sub-circuit is coupled to the second voltage signal terminal, the third node and the seventh node. The first pull-up sub-circuit is configured to transmit the second voltage signal from the second voltage signal terminal to the third node under control of a voltage at the seventh node.

In some embodiments, the first voltage divider sub-circuit includes a fifth transistor. A control electrode of the fifth transistor is coupled to the first voltage signal terminal, a first electrode of the fifth transistor is coupled to the second node, and a second electrode of the fifth transistor is coupled to the sixth node.

The energy storage sub-circuit includes a first capacitor. A first terminal of the first capacitor is coupled to the sixth node, and a second terminal of the first capacitor is coupled to the fifth node.

The first pull-down sub-circuit includes a first transistor and a second transistor. A control electrode of the first transistor is coupled to the sixth node, a first electrode of the first transistor is coupled to the second clock signal terminal, and a second electrode of the first transistor is coupled to the fifth node. A control electrode of the second transistor is coupled to the second clock signal terminal, a first electrode of the second transistor is coupled to the fifth node, and a second electrode of the second transistor is coupled to the third node.

The second voltage divider sub-circuit includes a sixth transistor. A control electrode of the sixth transistor is coupled to the first voltage signal terminal, a first electrode of the sixth transistor is coupled to the first node, and a second electrode of the sixth transistor is coupled to the seventh node.

The pull-up control sub-circuit includes one third transistor. A control electrode of the third transistor is coupled to the fifth node, a first electrode of the third transistor is coupled to the second voltage signal terminal, and a second electrode of the third transistor is coupled to the seventh node. Alternatively, the pull-up control sub-circuit includes at least two third transistors connected in series. Control electrodes of all third transistors in the at least two third transistors connected in series are coupled to the fifth node, a first electrode of a first third transistor in the at least two third transistors connected in series is coupled to the second voltage signal terminal, and a second electrode of a last third transistor in the at least two third transistors connected in series is coupled to the seventh node.

The first pull-up sub-circuit includes a fourth transistor. A control electrode of the fourth transistor is coupled to the seventh node, a first electrode of the fourth transistor is coupled to the second voltage signal terminal, and a second electrode of the fourth transistor is coupled to the third node.

In some embodiments, the second control sub-circuit includes a second pull-down sub-circuit and a second pull-up sub-circuit. The second pull-down sub-circuit is coupled to the first voltage signal terminal, the third clock signal terminal and the fourth node; and the second pull-down sub-circuit is configured to transmit the first voltage signal from the first voltage signal terminal to the fourth node to turn on the noise reduction sub-circuit under the control of the third clock signal from the third clock signal terminal. The second pull-up sub-circuit is coupled to the second voltage signal terminal, the third node and the fourth node; and the second pull-up sub-circuit is configured to transmit the second voltage signal from the second voltage signal terminal to the fourth node to turn off the noise reduction sub-circuit under the control of the voltage at the third node.

In some embodiments, the second pull-down sub-circuit includes a seventh transistor. A control electrode of the seventh transistor is coupled to the third clock signal terminal, a first electrode of the seventh transistor is coupled to the first voltage signal terminal, and a second electrode of the seventh transistor is coupled to the fourth node. The second pull-up sub-circuit includes an eighth transistor. A control electrode of the eighth transistor is coupled to the third node, a first electrode of the eighth transistor is coupled to the second voltage signal terminal, and a second electrode of the eighth transistor is coupled to the fourth node.

In some embodiments, the first input sub-circuit includes a first initialization sub-circuit and a third pull-down sub-circuit. The first initialization sub-circuit is coupled to the first clock signal terminal, the signal input terminal and the first node; and the first initialization sub-circuit is configured to transmit the input signal from the signal input terminal to the first node under the control of the first clock signal from the first clock signal terminal. The third pull-down sub-circuit is coupled to the first voltage signal terminal, the third clock signal terminal and the first node; and the third pull-down sub-circuit is configured to transmit the first voltage signal from the first voltage signal terminal to the first node under the control of the third clock signal from the third clock signal terminal.

In some embodiments, the first initialization sub-circuit includes a ninth transistor. A control electrode of the ninth transistor is coupled to the first clock signal terminal, a first electrode of the ninth transistor is coupled to the signal input terminal, and a second electrode of the ninth transistor is coupled to the first node. The third pull-down sub-circuit includes a tenth transistor. A control electrode of the tenth transistor is coupled to the third clock signal terminal, a first electrode of the tenth transistor is coupled to the first voltage signal terminal, and a second electrode of the ninth transistor is coupled to the first node.

In some embodiments, the second input sub-circuit includes a second initialization sub-circuit and a third pull-up sub-circuit. The second initializing sub-circuit is coupled to the first clock signal terminal, the first voltage signal terminal and the second node; and the second initialization sub-circuit is configured to transmit the first voltage signal from the first clock signal terminal to the second node under the control of the first clock signal from the first clock signal terminal. The third pull-up sub-circuit is coupled to the first clock signal terminal, the first node and the second node; and the third pull-up sub-circuit is configured to transmit the first clock signal from the first clock signal terminal to the second node under the control of the voltage at the first node.

In some embodiments, the second initialization sub-circuit includes an eleventh transistor. A control electrode of the eleventh transistor is coupled to the first clock signal terminal, a first electrode of the eleventh transistor is coupled to the first voltage signal terminal, and a second electrode of the eleventh transistor is coupled to the second node. The third pull-up sub-circuit includes one twelfth transistor. A control electrode of the twelfth transistor is coupled to the first node, a first electrode of the twelfth transistor is coupled to the first clock signal terminal, and a second electrode of the twelfth transistor is coupled to the second node. Alternatively, the third pull-up sub-circuit includes at least two twelfth transistors connected in series. Control electrodes of all twelfth transistors in the at least two twelfth transistors connected in series are coupled to the fifth node, a first electrode of a first twelfth transistor in the at least two twelfth transistors connected in series is coupled to the first clock signal terminal, and a second electrode of a last twelfth transistor in the at least two twelfth transistors connected in series is coupled to the second node.

In some embodiments, the noise reduction sub-circuit includes a second capacitor and a thirteenth transistor. A first terminal of the second capacitor is coupled to the fourth node, and a second terminal of the second capacitor is coupled to the signal output terminal. A control electrode of the thirteenth transistor is coupled to the fourth node, a first electrode of the thirteenth transistor is coupled to the first voltage signal terminal, and a second electrode of the thirteenth transistor is coupled to the signal output terminal.

In some embodiments, the noise reduction sub-circuit is further coupled to the first clock signal terminal, and the noise reduction sub-circuit further includes a fourth capacitor. A first terminal of the fourth capacitor is coupled to the first clock signal terminal, and a second terminal of the fourth capacitor is coupled to the fourth node.

In some embodiments, the output sub-circuit includes a third capacitor and a fourteenth transistor. A first terminal of the third capacitor is coupled to the second voltage signal terminal, and a second terminal of the third capacitor is coupled to the third node. A control electrode of the fourteenth transistor is coupled to the third node, a first electrode of the fourteenth transistor is coupled to the second voltage signal terminal, and a second electrode of the fourteenth transistor is coupled to the signal output terminal.

In another aspect, a gate driver circuit is provided. The gate driver circuit includes at least two shift registers that are cascaded and each according to any of the above embodiments.

In some embodiments, in every two adjacent shift registers, a signal input terminal of a latter-stage shift register is coupled to a signal output terminal of a former-stage shift register, and a signal input terminal of a first-stage shift register is coupled to an initialization signal terminal. The gate driver circuit further includes a first clock signal line, a second clock signal line, a third clock signal line and a fourth clock signal line. The first clock signal line is coupled to a first clock signal terminal of each shift register; the second clock signal line is coupled to a second clock signal terminal of each shift register; the third clock signal line is coupled to third clock signal terminals of odd-numbered stage shift registers; and the fourth clock signal line is coupled to third clock signal terminals of even-numbered stage shift registers.

In yet another aspect, a driving method for a shift register is provided. The driving method for the shift register is applied to the shift register according to any of the above embodiments. A single frame period includes a charging phase and an output phase. The driving method includes: in the charging phase, the first input sub-circuit transmitting the input signal from the signal input terminal to the first node under control of an operating voltage of the first clock signal from the first clock signal terminal; and the second input sub-circuit transmitting the first voltage signal from the first voltage signal terminal to the second node under the control of the operating voltage of the first clock signal from the first clock signal terminal; and in the output phase, the first control sub-circuit transmitting an operating voltage of the second clock signal from the second clock signal terminal to the third node under the control of the voltage at the second node; and the output sub-circuit transmitting the second voltage signal from the second voltage signal terminal to the signal output terminal under the control of the voltage at the third node, the noise reduction sub-circuit being turned off.

In some embodiments, the first input sub-circuit is further coupled to the third clock signal terminal and the first voltage signal terminal, and the first input sub-circuit is further configured to transmit the first voltage signal from the first voltage signal terminal to the first node under control of the third clock signal from the third clock signal terminal; the second input sub-circuit is further coupled to the first node, and the second input sub-circuit is further configured to transmit the first clock signal from the first clock signal terminal to the second node under control of a voltage at the first node; the first control sub-circuit is further coupled to the second voltage signal terminal and the first node, and the first control sub-circuit is further configured to transmit the second voltage signal from the second voltage signal terminal to the third node under the control of the voltage at the first node; and the second control sub-circuit is further coupled to the second voltage signal terminal and the third node, and the second control sub-circuit is further configured to transmit the second voltage signal from the second voltage signal terminal to the fourth node under the control of the voltage at the third node. In the output phase, the noise reduction sub-circuit being turned off includes: the second control sub-circuit transmitting the second voltage signal from the second voltage signal terminal to the fourth node under the control of the voltage at the third node; and the noise reduction sub-circuit being turned off under the control of the voltage at the fourth node. The single frame period further includes a noise-reduction phase, and the driving method further includes: in the noise-reduction phase, the first input sub-circuit transmitting the first voltage signal from the first voltage signal terminal to the first node under control of an operating voltage of the third clock signal from the third clock signal terminal; the second input sub-circuit transmitting a non-operating voltage of the first clock signal from the first clock signal terminal to the second node under control of the voltage at the first node; the first control sub-circuit transmitting the second voltage signal from the second voltage signal terminal to the third node under the control of the voltage at the first node; the output sub-circuit being turned off under the control of the voltage at the third node; the second control sub-circuit transmitting the first voltage signal from the first voltage signal terminal to the fourth node under the control of the operating voltage of the third clock signal from the third clock signal terminal; and the noise reduction sub-circuit being turned on under the control of the voltage at the fourth node.

In yet another aspect, a display apparatus is provided. The display apparatus includes the gate driver circuit according to any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
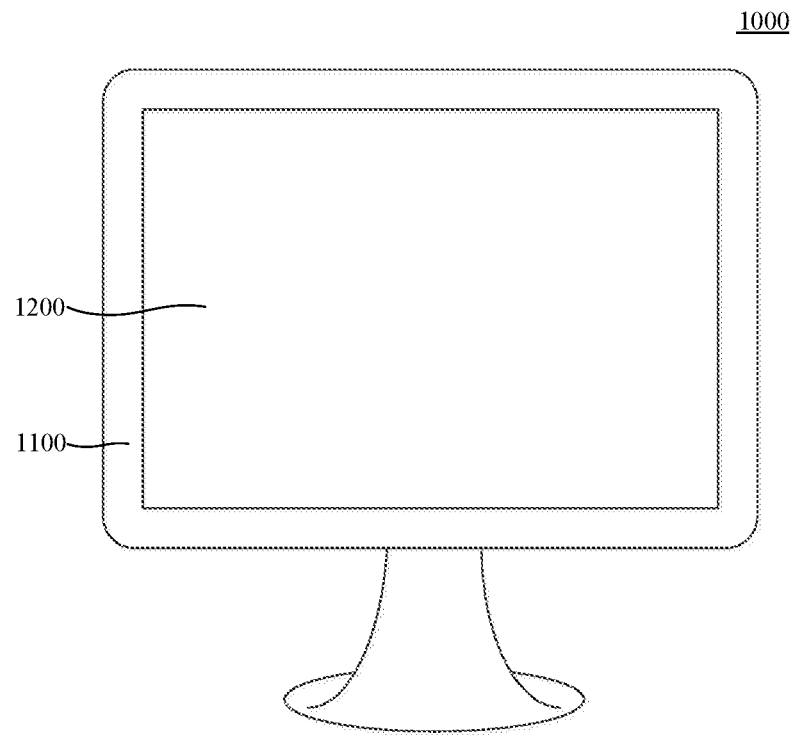
FIG. 1 is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, unless otherwise specified, the term "a plurality of" or "the plurality of" means two or more.

In the shift register provided by the embodiments of the present disclosure, transistors used in the shift register may be thin film transistors (TFTs), field-effect transistors (e.g., metal oxide semiconductor field-effect transistors (MOSFETs)), or other switching devices with same characteristics. The embodiments of the present disclosure are all described by considering an example in which the transistors are the thin film transistors.

In the shift register provided by the embodiments of the present disclosure, the transistors used in the shift register may be all P-type transistors. A control electrode of a thin film transistor is a gate of the thin film transistor, a first electrode of the thin film transistor is one of a source and a drain of the thin film transistor, and a second electrode of the thin film transistor is the other of the source and the drain of the thin film transistor. Since the source and the drain of the thin film transistor may be symmetrical in structure, there may be no difference in structure between the source and the drain of the thin film transistor. That is, there may be no difference in structure between the first electrode and the second electrode of the thin film transistor in the embodiments of the present disclosure. For example, the first electrode of the thin film transistor is the source, and the second electrode of the thin film transistor is the drain.

In the shift register provided by the embodiments of the present disclosure, a capacitor may be a capacitor device separately manufactured through a process. For example, the capacitor is realized by manufacturing special capacitor electrodes, and each capacitor electrode of the capacitor may be a metal layer, a semiconductor layer (e.g., polysilicon doped with impurities), or the like. Alternatively, the capacitor may be realized through parasitic capacitance between transistors, or through parasitic capacitance between a transistor itself and another device or wire, or through parasitic capacitance between lines of a circuit itself.

In the shift register provided by the embodiments of the present disclosure, "a first node", "a second node" and the like do not represent actual components, but represent junctions of related electrical connections in a circuit diagram. That is to say, these nodes are nodes equivalent to the junctions of the related electrical connections in the circuit diagram.

In the shift register provided by the embodiments of the present disclosure, the "operating voltage" refers to a voltage that enables the operated transistor included in the shift register to be turned on, and correspondingly, the "non-operating voltage" refers to a voltage that cannot cause the operated transistor included in the shift register to be turned on (i.e., the transistor being turned off). Generally, for the square wave pulse signal used by a shift register circuit during operation, the operating voltage corresponds to the voltage of the square wave pulse portion of the square wave pulse signal, and the non-operating voltage corresponds to the voltage of the non-square wave pulse portion of the square wave pulse signal. For example, on the premise that the transistors included in the shift register are P-type transistors, the magnitude of the operating voltage is lower than the magnitude of the non-operating voltage.

In the embodiments of the present disclosure, the term "pull up" refers to charging a node or an electrode of a transistor, so that an absolute value of a voltage of the node or the electrode increases, thereby realizing the operating (e.g., being turned off) of a corresponding transistor. the term "pull down" refers to performing an outputting on a node or an electrode of a transistor, so that an absolute value of a voltage of the node or the electrode decreases, thereby realizing the operating (e.g., being turned on) of a corresponding transistor.

As shown in FIG. 1, some embodiments of the present disclosure provide a display apparatus 1000. The display apparatus 1000 may be a television, a mobile phone, a computer, a notebook computer, a tablet computer, a personal digital assistant (PDA), an on-board computer, etc.

As shown in FIG. 1, the display apparatus 1000 includes a frame 1100, and a display panel 1200, a circuit board, a display driver integrated circuit, and other electronic components that are disposed in the frame 1100.

The display panel 1200 may be an organic light-emitting diode (OLED) display panel, a quantum dot light-emitting diode (QLED) display panel, or a micro light-emitting diode (Micro LED) display panel, which is not limited in the embodiments of the present disclosure.

Some embodiments of the present disclosure will be schematically described below by considering an example where the display panel 1200 is the OLED display panel.

Figure 2:
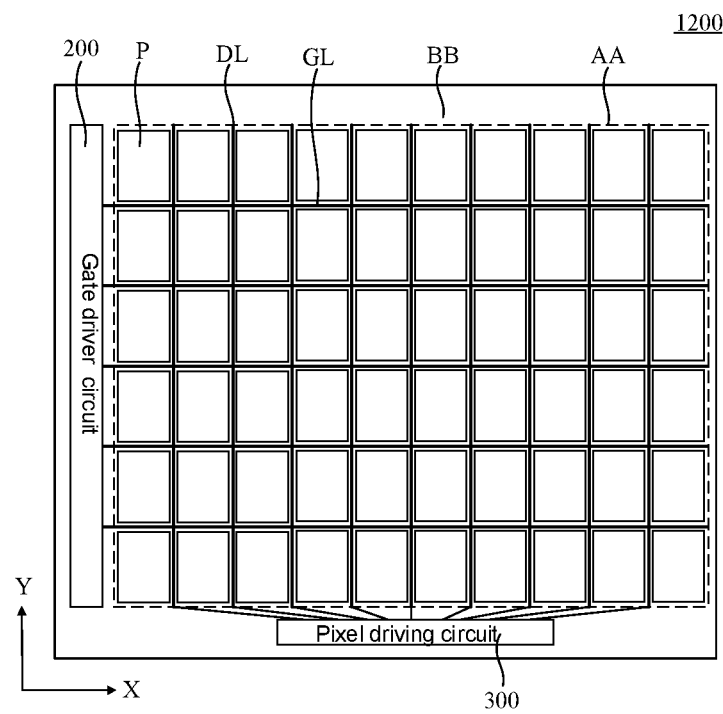
FIG. 2 is a structural diagram of a display panel, in accordance with some embodiments.

In some embodiments, as shown in FIG. 2, the display panel 1200 has a display area AA and a peripheral area BB located on at least one side of the display area AA. FIG. 2 shows an example in which the peripheral area BB is disposed around the display area AA.

Figure 3:
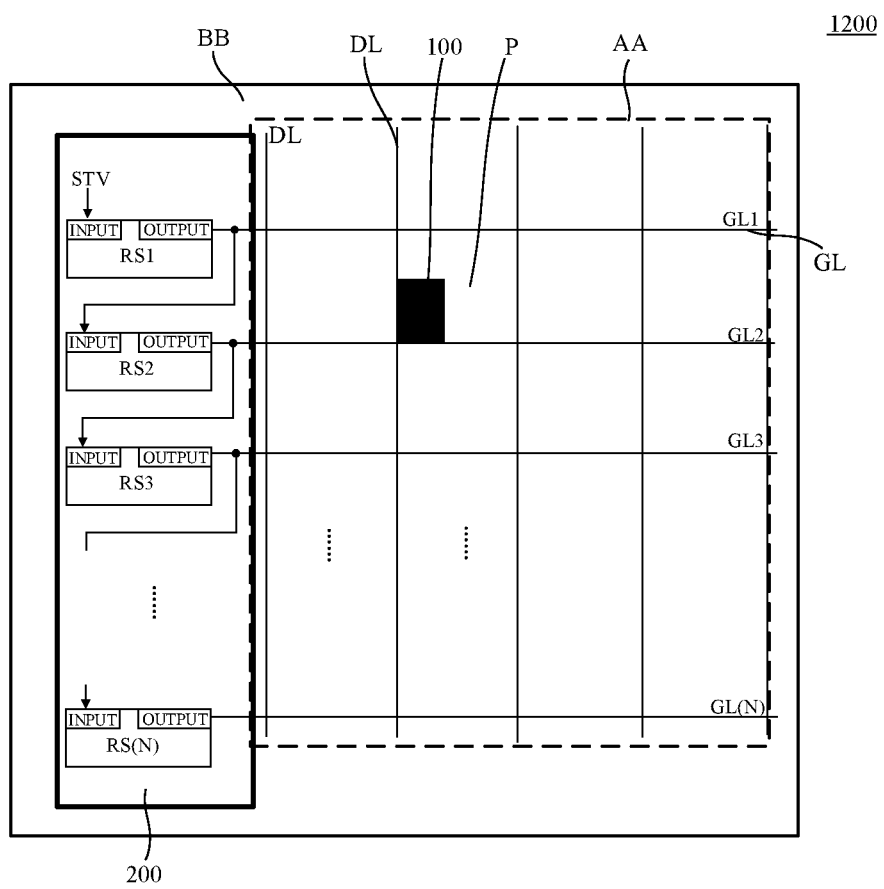
FIG. 3 is an architectural diagram of a gate driver of a display panel, in accordance with some embodiments.

Referring to FIGS. 2 and 3, the display area AA in the display panel 1200 is provided with sub-pixels P of a plurality of light-emitting colors therein. The sub-pixels P of the plurality of light-emitting colors include at least first sub-pixels of the light-emitting color being a first color, second sub-pixels of the light-emitting color being a second color, and third sub-pixels of the light-emitting color being a third color. The first color, the second color and the third color are three primary colors (e.g., red, green and blue).

For convenience of description, the embodiments of the present disclosure will be described by considering an example in which the sub-pixels P are arranged in a matrix. In this case, sub-pixels P arranged in a line in a horizontal direction X are referred to as sub-pixels in a same row, and sub-pixels P arranged in a line in a vertical direction Y are referred to as sub-pixels in a same column.

Figure 4A:
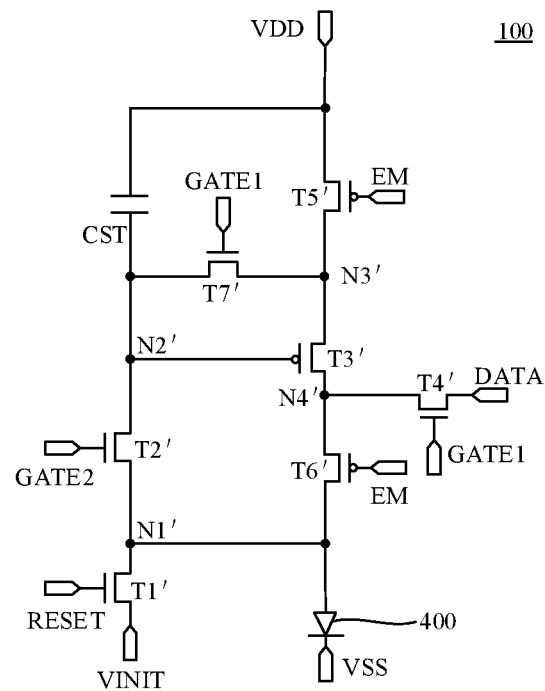
FIG. 4A is a structural diagram of a pixel driving circuit and an element to be driven, in accordance with some embodiments.

Referring to FIGS. 3 and 4A, each sub-pixel P is provided with a pixel driving circuit 100 therein. Control electrodes of the transistors T of pixel driving circuits 100 located in a same row are coupled to a same gate line GL, and first electrodes (e.g., sources) of transistors T of pixel driving circuits 100 located in a same column are coupled to a same data line DL.

In some embodiments, referring to FIG. 4A, the pixel driving circuit 100 includes one driving transistor and six switching transistors. The driving transistor and the six switching transistors may all adopt low temperature polysilicon thin film transistors (LTPS-TFTs), or may all adopt oxide thin film transistors (oxide-TFTs), or may adopt both low temperature polysilicon thin film transistors and oxide thin film transistors.

An active layer of the low temperature polysilicon thin film transistor adopts low temperature polysilicon (LTPS), and an active layer of the oxide thin film transistor adopts oxide semiconductor such as indium gallium zinc oxide or indium gallium tin oxide. The low temperature polysilicon thin film transistor has advantages such as high mobility and high charging rate, and the oxide thin film transistor has advantages such as low leakage current. The low temperature polysilicon thin film transistor and the oxide thin film transistor are integrated in a display substrate to produce a low temperature polycrystalline oxide (LTPO) display substrate, which may realize low-frequency drive, reduce power consumption, and improve display quality by utilizing the advantages of both the low temperature polysilicon thin film transistor and the oxide thin film transistor.

In conjunction with FIGS. 2, 4A and 4B, the pixel driving circuit 100 included in the LTPO display substrate will be schematically described below by considering an example in which the pixel driving circuit includes seven transistors T and one capacitor CST. In the following description, the pixel driving circuit 100 is any one of pixel driving circuits 100 in sub-pixels P located in the Nth row, and N is a positive integer.

For example, as shown in FIG. 4A, the pixel driving circuit 100 includes seven transistors T and a capacitor CST. A control electrode of a first transistor T1' in the pixel driving circuit 100 is coupled to a reset signal terminal RESET, control electrodes of both a fourth transistor T4' and a seventh transistor T7' in the pixel driving circuit 100 are both coupled to a first scanning signal terminal GATE1, and a control electrode of a second transistor T2' in the pixel driving circuit 100 is coupled to a second scanning signal terminal GATE2. The first transistor T1' is a reset transistor, and the second transistor T2', the fourth transistor T4' and the seventh transistor T7' are scanning transistors. The first transistor T1', the second transistor T2', the fourth transistor T4' and the seventh transistor T7' are all N-type oxide TFTs. A control electrode of a third transistor T3' is coupled to a terminal of a capacitor CST, and control electrodes of a fifth transistor T5' and a sixth transistor T6' are both coupled to an enable signal terminal EM. The third transistor T3' is a driving transistor, and the fifth transistors T5' and the sixth transistor T6' are switching transistors. The third transistor T3', the fifth transistor T5' and the sixth transistor T6' are all P-type LTPS-TFTs.

In this case, high charge mobility, high stability and high scalability may be achieved at low production costs in combination with the advantages of both high stability and low production costs of the oxide TFTs under the low refresh rate and the advantage of high mobility of the LTPS-TFTs.

It will be noted that, first scanning signal terminals GATE1 of the pixel driving circuits 100 in the sub-pixels in the Nth row are coupled to a gate line GL(N), second scanning signal terminals GATE2 of the pixel driving circuits 100 in the sub-pixels in the Nth row are coupled to a gate line GL(N-1), and reset signal terminals RESET of the pixel driving circuits 100 in the sub-pixels in the Nth row are coupled to the gate line GL(N-1). Of course, the second scanning signal terminal GATE2 and the reset signal terminal RESET may be coupled to two gate lines GL, respectively, and the gate line GL coupled to the reset signal terminal RESET and the gate line GL coupled to the second scanning signal terminal GATE2 may be driven by different gate driver circuits 200.

Figure 4B:
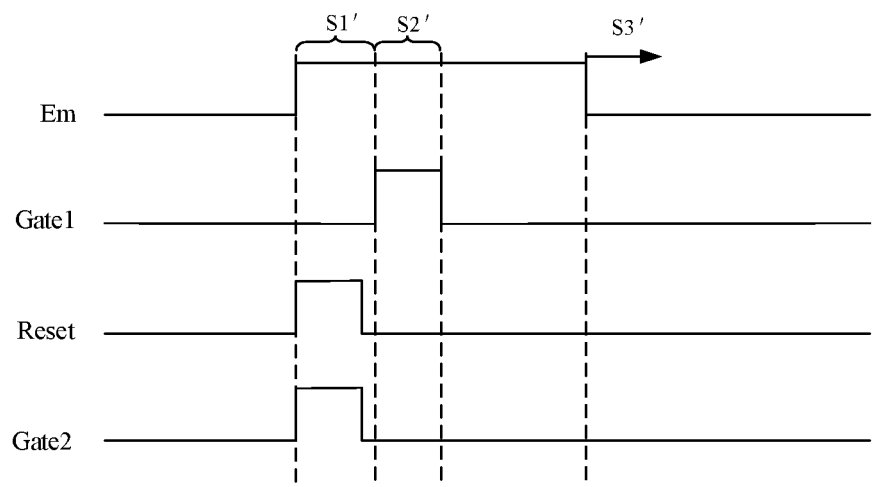
FIG. 4B is a driving timing diagram of a pixel driving circuit, in accordance with some embodiments.

Referring to FIG. 4B, one frame period of the pixel driving circuit 100 includes a reset phase S1', a scanning phase S2' and a light-emitting phase S3'. In the reset phase S1', the first transistor T1' is turned on under control of a reset signal Reset from the reset signal terminal RESET, the second transistor T2' is turned on under control of a second scanning signal Gate2 from the second scanning signal terminal GATE2, and voltages of a first node N1' and a second node N2' are reset to be initialization voltage signals. In the scanning phase S2', the fourth transistor T4' and the seventh transistor T7' are both turned on under control of a first scanning signal Gate1 from the first scanning signal terminal GATE1, the third transistor T3' is turned on under control of a voltage at the second node N2', and a data signal from a data signal terminal DATA is written into the capacitor CST. In the light-emitting phase S3', the fifth transistor T5' and the sixth transistor T6' are turned on under control of an enable signal Em from the enable signal terminal EM, and the third transistor T3' is turned on under control of the voltage at the second node N2', so as to output a driving current signal to an element 400 to be driven.

However, since the pixel driving circuit 100 needs to be driven by scanning signals suitable for N-type transistors, and the scanning transistors are all oxide TFTs, which have charge mobility lower than charge mobility of low temperature polycrystalline oxide TFTs and a poor writing ability. Therefore, the output ability of the gate driver circuit 200 needs to be improved.

As shown in FIG. 2, the peripheral area BB in the display panel 1200 is provided with a gate driver circuit 200 and a data driver circuit 300 therein. In some embodiments, the gate driver circuit 200 may be disposed on a side in an extending direction of the gate lines GL, and the data driver circuit 300 may be disposed on a side in an extending direction of the data lines DL, so that the pixel driving circuits 100 in the display panel 1200 are driven for display.

In some embodiments, the gate driver circuit 200 is a gate driver integrated circuit (IC). In some other embodiments, the gate driver circuit 200 is a gate driver on array (GOA) circuit. That is, the gate driver circuit 200 is directly integrated in an array substrate of the display panel 1200.

Compared with the gate driver IC, setting the gate driver circuit 200 as the GOA circuit may reduce the manufacturing cost of the display panel 1200 and reduce a frame size of the display panel 1200, so as to realize a narrow frame design. The following embodiments will be described by considering an example in which the gate driver circuit 200 is the GOA circuit.

It will be noted that, FIGS. 2 and 3 are only schematic and described by considering an example in which the gate driver circuit 200 is disposed on a single side of the peripheral area BB of the display panel 1200, and the gate lines GL are sequentially driven row by row from the single side, i.e., single-sided driving. In some embodiments, gate driver circuits 200 may be disposed on two sides of the peripheral area BB in the display panel 1200 in the extending direction of the gate lines GL, and the gate lines GL are sequentially driven row by row from two sides simultaneously by the two gate driver circuits 200, i.e., double-sided driving. In some other embodiments, gate driver circuits 200 may be disposed on two sides of the peripheral area BB in the display panel 1200 in the extending direction of the gate lines GL, and the gate lines GL are sequentially driven row by row from two sides alternately by the two gate driver circuits 200, i.e., alternate driving. The following embodiments of the present disclosure will all be described by considering an example of the single-sided driving.

In some embodiments of the present disclosure, as shown in FIG. 3, the gate driver circuit 200 includes at least two shift registers RS that are cascaded.

Referring to FIG. 3, the gate driver circuit 200 includes N shift registers (RS1, RS2, . . . , RS(N)) that are cascaded. In this case, the N shift registers (RS1, RS2, . . . , RS(N)) that are cascaded are connected to N gate lines (GL1, GL2, . . . , GL(N)) in one-to-one correspondence, and N is a positive integer.

In some embodiments, in every two adjacent shift registers RS, the signal input terminal INPUT of a latter-stage shift register RS is coupled to the signal output terminal OUTPUT of a former-stage shift register RS, and the signal input terminal INPUT of the first-stage shift register RS1 is coupled to an initialization signal terminal STV.

Figure 5:
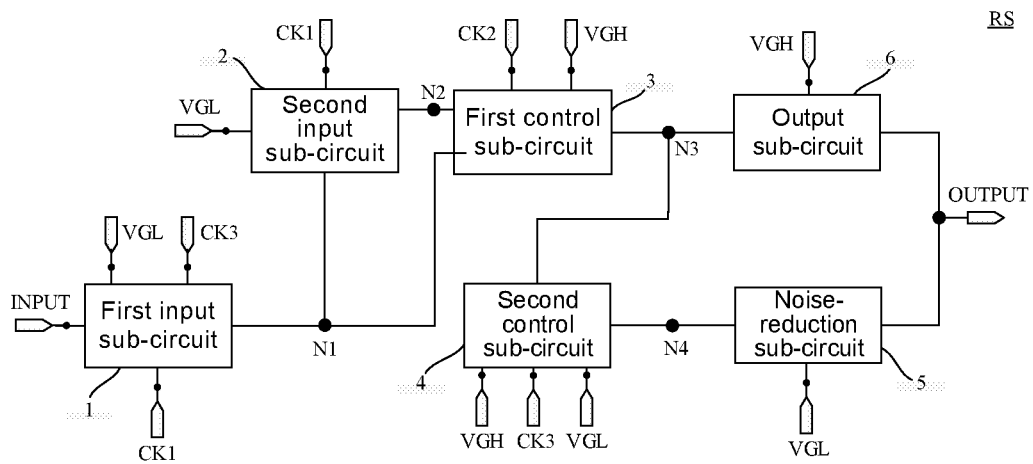
FIG. 5 is a block diagram showing a circuit structure of a shift register, in accordance with some embodiments.

Some embodiments of the present disclosure provide a shift register RS. As shown in FIG. 5, the shift register RS includes a first input sub-circuit 1, a second input sub-circuit 2, a first control sub-circuit 3, a second control sub-circuit 4, a noise reduction sub-circuit 5 and an output sub-circuit 6.

The first input sub-circuit 1 is coupled to a first clock signal terminal CK1, a signal input terminal INPUT and the first node N1, and the first input sub-circuit 1 is configured to transmit an input signal Input from the signal input terminal INPUT to the first node N1 under control of a first clock signal Ck1 from the first clock signal terminal CK1.

For example, in a case where a voltage of the first clock signal Ck1 transmitted by the first clock signal terminal CK1 is the operating voltage, the first input sub-circuit 1 may be turned on under control of the first clock signal Ck1 from the first clock signal terminal CK1 to transmit the input signal Input from the signal input terminal INPUT to the first node N1.

For example, in a charging phase S1 (referring to FIG. 12), the voltage of the first clock signal Ck1 transmitted by the first clock signal terminal CK1 is the operating voltage, the first input sub-circuit 1 is turned on under the control of the first clock signal Ck1 from the first clock signal terminal CK1 to transmit the input signal Input (non-operating voltage) from the signal input terminal INPUT to the first node N1, so that a voltage at the first node N1 is raised.

The second input sub-circuit 2 is coupled to the first clock signal terminal CK1, a first voltage signal terminal VGL and a second node N2, and the second input sub-circuit 2 is configured to transmit a first voltage signal from the first voltage signal terminal VGL to the second node N2 under the control of the first clock signal Ck1 from the first clock signal terminal CK1.

For example, in the case where the voltage of the first clock signal Ck1 transmitted by the first clock signal terminal CK1 is the operating voltage, the second input sub-circuit 2 may be turned on under the control of the first clock signal Ck1 from the first clock signal terminal CK1 to transmit the first voltage signal from the first voltage signal terminal VGL to the second node N2.

For example, in the charging phase S1 (referring to FIG. 12), the voltage of the first clock signal Ck1 transmitted by the first clock signal terminal CK1 is the operating voltage, the second input sub-circuit 2 is turned on under the control of the first clock signal Ck1 from the first clock signal terminal CK1 to transmit the first voltage signal from the first voltage signal terminal VGL to the second node N2, so that a voltage at the second node N2 is lowered.

The first control sub-circuit 3 is coupled to a second clock signal terminal CK2, the second node N2 and a third node N3, and the first control sub-circuit 3 is configured to transmit a second clock signal Ck2 from the second clock signal terminal CK2 to the third node N3 under control of the voltage at the second node N2.

For example, in a case where the voltage at the second node N2 is the operating voltage, the first control sub-circuit 3 may be turned on under the control of the voltage at the second node N2 to transmit the second clock signal Ck2 from the second clock signal terminal CK2 to the third node N3.

For example, in an output phase S2 (referring to FIG. 12), the voltage of the first clock signal Ck1 is the non-operating voltage, the voltage at the second node N2 is in a floating state, and the voltage at the second node N2 is the voltage in the charging phase S1, that is, the first voltage signal, which is the operating voltage. Based on this, the first control sub-circuit 3 is turned on under the control of the voltage at the second node N2 to transmit the second clock signal Ck2 (the operating voltage) from the second clock signal terminal CK2 to the third node N3, so that a voltage at the third node N3 is lowered.

The second control sub-circuit 4 is coupled to a third clock signal terminal CK3, the first voltage signal terminal VGL and a fourth node N4, and the second control sub-circuit 4 is configured to transmit the first voltage signal from the first voltage signal terminal VGL to the fourth node N4 under control of a third clock signal Ck3 from the third clock signal terminal CK3.

For example, in a case where a voltage of the third clock signal Ck3 transmitted by the third clock signal terminal CK3 is the operating voltage, the second control sub-circuit 4 may be turned on under control of the third clock signal Ck3 from the third clock signal terminal CK3 to transmit the first voltage signal from the first voltage signal terminal VGL to the fourth node N4.

For example, in a noise-reduction phase S3 (referring to FIG. 12), the voltage of the third clock signal Ck3 transmitted by the third clock signal terminal CK3 is the operating voltage, the second control sub-circuit 4 is turned on under the control of the third clock signal Ck3 from the third clock signal terminal CK3 to transmit the first voltage signal from the first voltage signal terminal VGL to the fourth node N4, so that a voltage at the fourth node N4 is lowered.

The noise reduction sub-circuit 5 is coupled to the first voltage signal terminal VGL, the fourth node N4 and a signal output terminal OUTPUT, and the noise reduction sub-circuit 5 is configured to transmit the first voltage signal from the first voltage signal terminal VGL to the signal output terminal OUTPUT under control of the voltage at the fourth node N4.

For example, in a case where the voltage at the fourth node N4 is the operating voltage, the noise reduction sub-circuit 5 may be turned on under the control of the voltage at the fourth node N4 to transmit the first voltage signal from the first voltage signal terminal VGL to the signal output terminal OUTPUT.

For example, in the noise-reduction phase S3 (referring to FIG. 12), the voltage at the fourth node N4 is the operating voltage, the noise reduction sub-circuit 5 is turned on under the control of the voltage at the fourth node N4 to transmit the first voltage signal from the first voltage signal terminal VGL to the signal output terminal OUTPUT, so as to perform noise-reduction processing on the signal output terminal OUTPUT.

The output sub-circuit 6 is coupled to a second voltage signal terminal VGH, the third node N3 and the signal output terminal OUTPUT, and the output sub-circuit 6 is configured to transmit a second voltage signal from the second voltage signal terminal VGH to the signal output terminal OUTPUT under control of the voltage at the third node N3.

For example, in a case where the voltage at the third node N3 is the operating voltage, the output sub-circuit 6 may be turned on under the control of the voltage at the third node N3 to transmit the second voltage signal from the second voltage signal terminal VGH to the signal output terminal OUTPUT.

For example, in the output phase S2 (referring to FIG. 12), the voltage at the third node N3 is the operating voltage, the output sub-circuit 6 is turned on under the control of the voltage at the third node N3 to transmit the second voltage signal terminal from the second voltage signal terminal VGH to the signal output terminal OUTPUT, so that the signal output terminal OUTPUT of the shift register RS outputs a scanning signal.

The scanning signal output by the signal output terminal OUTPUT may be used as a gate scanning signal, and may also be used as a cascade signal. In addition, the first voltage signal terminal VGL is configured to transmit a direct current (DC) low voltage signal (the operating voltage), and the second voltage signal terminal VGH is configured to transmit a DC high voltage signal (the non-operating voltage).

It will be noted from the above that, in the shift register RS provided by some embodiments of the present disclosure, the second input sub-circuit 2 transmits the first voltage signal from the first voltage signal terminal VGL to the second node N2 under the control of the first clock signal Ck1 from the first clock signal terminal CK1, the first control sub-circuit 3 transmits the second clock signal Ck2 from the second clock signal terminal CK2 to the third node N3 under the control of the voltage at the second node N2, and the output sub-circuit 6 transmits the second voltage signal from the second voltage signal terminal VGH to the signal output terminal OUTPUT under the control of the voltage at the third node N3. As a result, the signal output terminal OUTPUT of the shift register RS outputs the scanning signal. In addition, the second control sub-circuit 4 transmits the first voltage signal from the first voltage signal terminal VGL to the fourth node N4 under the control of the third clock signal Ck3 from the third clock signal terminal CK3, and the noise reduction sub-circuit 5 transmits the first voltage signal from the first voltage signal terminal VGL to the signal output terminal OUTPUT under the control of the voltage at the fourth node N4, so as to perform the noise-reduction processing on the signal output terminal OUTPUT.

In this way, in the output phase, the output sub-circuit 6 transmits the second voltage signal from the second voltage signal terminal VGH to the signal output terminal OUTPUT under the control of the voltage at the third node N3, so as to output the second voltage signal. Compared with outputting the scanning signal through a square wave pulse signal terminal (the output voltage including the operating voltage and the non-operating voltage), the shift register RS outputs the scanning signal through a constant voltage terminal (the second voltage signal terminal VGH), which may reduce an effect of the load of the signal output terminal OUTPUT on the voltage signal output by the shift register RS, so that the voltage signal output by the signal output terminal OUTPUT of the shift register RS may be more stable. In addition, the voltage of the second voltage signal from the second voltage signal terminal VGH may be controlled according to the driving requirements of the pixel driving circuit, so as to meet the driving requirements of the pixel driving circuit.

It will be noted that, the shift register RS provided by the embodiments of the present disclosure is not limited to be applied to the pixel driving circuit 100 shown in FIG. 4A, the shift register RS may also be applied to other pixel driving circuits 100 that use N-type transistors as scanning transistors.

In some embodiments, as shown in FIG. 5, the first input sub-circuit 1 is further coupled to the third clock signal terminal CK3 and the first voltage signal terminal VGL, and the first input sub-circuit 1 is further configured to transmit the first voltage signal from the first voltage signal terminal VGL to the first node N1 under control of the third clock signal Ck3 from the third clock signal terminal CK3.

For example, in a case where the voltage of the third clock signal Ck3 transmitted by the third clock signal terminal CK3 is the operating voltage, the first input sub-circuit 1 may transmit the first voltage signal from the first voltage signal terminal VGL to the first node N1 under the control of the third clock signal Ck3 from the third clock signal terminal CK3.

For example, in the noise-reduction phase S3 (referring to FIG. 12), the voltage of the third clock signal Ck3 transmitted by the third clock signal terminal CK3 is the operating voltage, and the first input sub-circuit 1 is turned on under the control of the third clock signal Ck3 from the third clock signal terminal CK3 to transmit the first voltage signal from the first voltage signal terminal VGL to the first node N1, so that the voltage at the first node N1 is lowered.

The second input sub-circuit 2 is further coupled to the first node N1, and the second input sub-circuit 2 is further configured to transmit the first clock signal Ck1 from the signal terminal CK1 to the second node N2 under control of the voltage at the first node N1.

For example, in a case where the voltage at the first node N1 is the operating voltage, the second input sub-circuit 2 may be turned on under the control of the voltage at the first node N1 to transmit the first clock signal CK1 from the first clock signal terminal CK1 to the second node N2.

Figure 12:
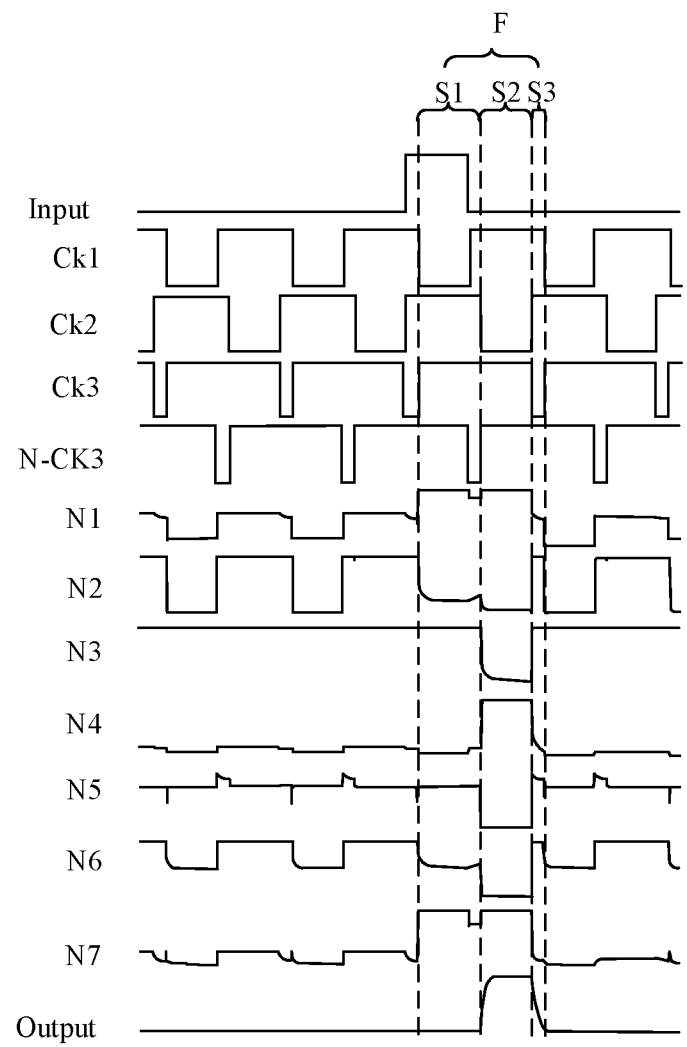
FIG. 12 is a driving timing diagram of a shift register, in accordance with some embodiments.

For example, referring to FIG. 12, in a frame, a falling edge of the input signal from the signal input terminal INPUT is aligned with a rising edge of the first clock signal from the first clock signal terminal CK1, and the rising edge of the first clock signal from the first clock signal terminal CK1 is earlier than a falling edge of the second clock signal from the second clock signal terminal CK2.

In this way, during time when the signal input terminal INPUT continuously outputs the operating voltage (except for the frame where the output phase S2 is located), and between the rising edge of the first clock signal from the first clock signal terminal CK1 and the falling edge of the first clock signal from the second clock signal terminal CK2 in a frame, since the voltage of the first clock signal Ck1 is a non-operating voltage, the voltage at the first node N1 is in a floating state. Based on this, the voltage at the first node N1 is the voltage when the voltage of the first clock signal Ck1 in the previous phase is the operating voltage, that is, the operating voltage from the signal input terminal INPUT. That is to say, the voltage at the first node N1 is the operating voltage. Therefore, the second input sub-circuit 2 is turned on under the control of the voltage at the first node N1 to transmit the first clock signal Ck1 (non-operating voltage) from the first clock signal terminal CK1 to the second node N2, so that the voltage at the second node N2 is raised. As a result, it may be ensured that the second clock signal Ck2 (operating voltage) in the next phase can never be transmitted to the third node N3, thereby ensuring that the voltage at the third node N3 is always the non-operating voltage during the time when the signal input terminal INPUT continuously outputs the operating voltage (except for the frame where the output phase S2 is located), and thus the output sub-circuit 6 is always turned off.

The first control sub-circuit 3 is further coupled to the second voltage signal terminal VGH and the first node N1, and the first control sub-circuit 3 is further configured to transmit the second voltage signal from the second voltage signal terminal VGH to the third node N3 under the control of the voltage at the first node N1.

For example, in the case where the voltage at the first node N1 is the operating voltage, the first control sub-circuit 3 may be turned on under the control of the voltage at the first node N1 to transmit the second voltage signal from the second voltage signal terminal VGH to the third node N3.

For example, in the noise-reduction phase S3 (referring to FIG. 12), the voltage at the first node N1 is the operating voltage, the first control sub-circuit 3 is turned on under the control of the voltage at the first node N1 to transmit the second voltage signal from the second voltage signal terminal VGH to the third node N3, so that the voltage at the third node N3 is raised.

In this way, in the noise-reduction phase S3 (referring to FIG. 12), the output sub-circuit 6 keeps to be turned off under the control of the voltage at the third node N3, and stops transmitting the second voltage signal from the second voltage signal terminal VGH to the signal output terminal OUTPUT (that is, stops outputting the scanning signal). Moreover, the noise-reduction processing performed by the noise reduction sub-circuit 5 on the signal output terminal OUTPUT is not affected.

The second control sub-circuit 4 is further coupled to the second voltage signal terminal VGH and the third node N3, and the second control sub-circuit 4 is further configured to transmit the second voltage signal from the second voltage signal terminal VGH to the fourth node N4 under the control of the voltage at the third node N3.

For example, in the case where the voltage at the third node N3 is the operating voltage, the second control sub-circuit 4 may be turned on under the control of the voltage at the third node N3 to transmit the second voltage signal from the second voltage signal terminal VGH to the fourth node N4.

For example, in the output phase S2 (referring to FIG. 12), the voltage at the third node N3 is the operating voltage, the second control sub-circuit 4 is turned on under the control of the voltage at the third node N3 to transmit the second voltage signal from the second voltage signal terminal VGH to the fourth node N4, so that the voltage at the fourth node N4 is raised.

In this way, in the output phase S2, the noise reduction sub-circuit 5 keeps to be turned off under the control of the voltage at the fourth node N4, and stops transmitting the first voltage signal from the first voltage signal terminal VGL to the signal output terminal OUTPUT. As a result, the output of the scanning signal from the signal output terminal OUTPUT is not affected.

Figure 6:
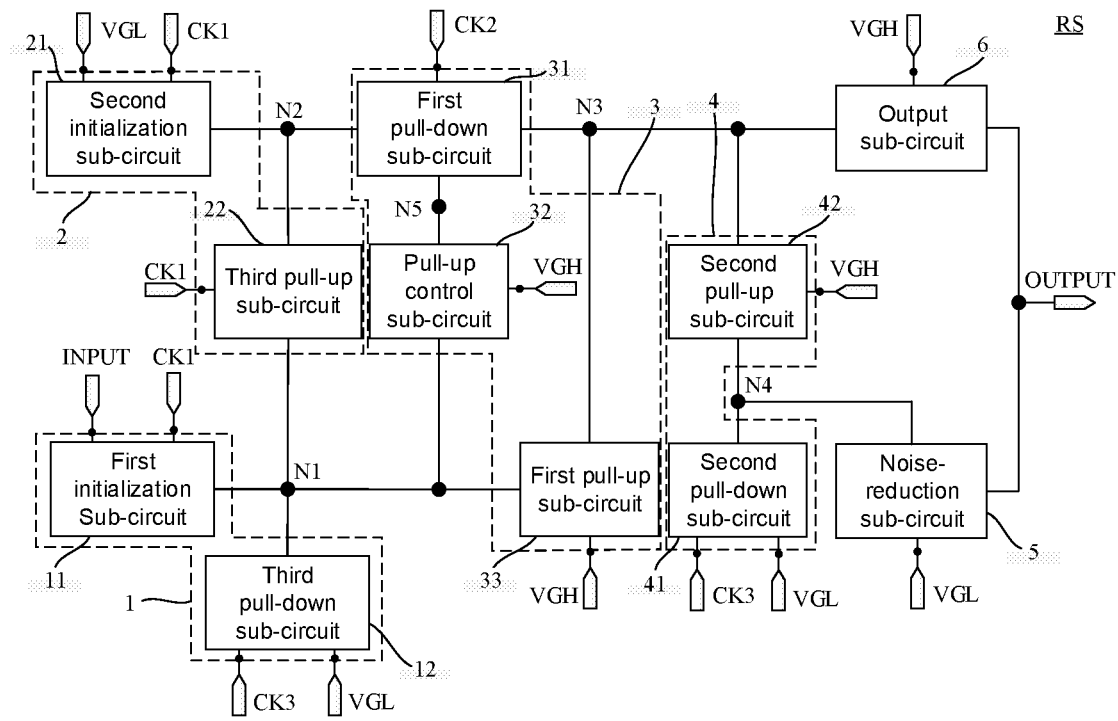
FIG. 6 is a block diagram showing a circuit structure of another shift register, in accordance with some embodiments.

In some embodiments, as shown in FIGS. 5 and 6, the first control sub-circuit 3 includes a first pull-down sub-circuit 31, a pull-up control sub-circuit 32 and a first pull-up sub-circuit 33.

The first pull-down sub-circuit 31 is coupled to the second clock signal terminal CK2, the second node N2, the third node N3 and a fifth node N5, and the first pull-down sub-circuit 31 is configured to transmit the second clock signal Ck2 from the second clock signal terminal CK2 to the fifth node N5 or to both the fifth node N5 and the third node N3 under the control of the voltage at the second node N2.

Figure 7:
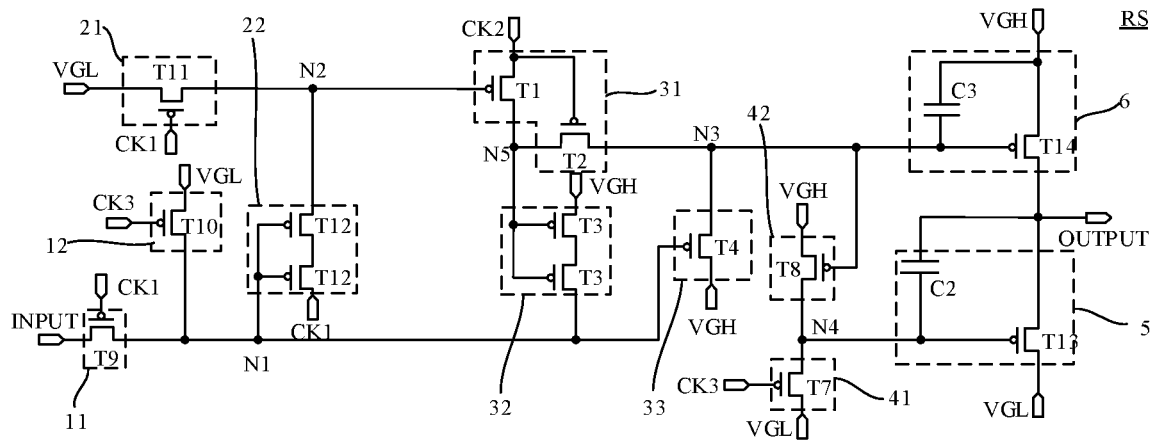
FIG. 7 is a circuit diagram of a shift register, in accordance with some embodiments.

For example, as shown in FIG. 7, the first pull-down sub-circuit 31 includes a first transistor T1 and a second transistor T2. A control electrode of the first transistor T1 is coupled to the second node N2, a first electrode of the first transistor T1 is coupled to the second clock signal terminal CK2, and a second electrode of the first transistor T1 is coupled to the fifth node N5. A control electrode of the second transistor T2 is coupled to the second clock signal terminal CK2, a first electrode of the second transistor T2 is coupled to the fifth node N5, and a second electrode of the second transistor T2 is coupled to the third node N3.

The pull-up control sub-circuit 32 is coupled to the second voltage signal terminal VGH, the first node N1 and the fifth node N5, and the pull-up control sub-circuit 32 is configured to transmit the second voltage signal from the second voltage signal terminal VGH to the first node N1 under control of a voltage at the fifth node N5.

For example, the pull-up control sub-circuit 32 includes third transistor(s) T3. Control electrodes of the third transistor(s) T3 are coupled to the fifth node N5, a first electrode of the third transistor(s) T3 is coupled to the second voltage signal terminal VGH, and a second electrode of the third transistor(s) T3 is coupled to the first node N1.

It will be noted that, the pull-up control sub-circuit 32 may include at least two third transistors T3 that are connected in series in sequence. Control electrodes of all third transistors T3 in the at least two third transistors T3 are coupled to the fifth node N5, a first electrode of the first third transistor T3 in the at least two third transistors T3 is coupled to the second voltage signal terminal VGH, and a second electrode of the last third transistor T3 in the at least two third transistors T3 is coupled to the first node N1. Here, by using the at least two third transistors T3 that are connected in series in sequence, it may be possible to effectively prevent the voltage at the first node N1 from fluctuating due to the electric leakage of the third transistor T3, which is beneficial to keep the voltage at the first node N1 stable.

For example, as shown in FIG. 7, there are two third transistors T3. Control electrodes of the two third transistors T3 are both coupled to the fifth node N5, the two third transistors T3 are connected in series in sequence, a first electrode of the first third transistor T3 is coupled to the second voltage signal terminal VGH, and a second electrode of the second third transistor T3 is coupled to the first node N1.

The first pull-up sub-circuit 33 is coupled to the second voltage signal terminal VGH, the first node N1 and the third node N3, and the first pull-up sub-circuit 33 is configured to transmit the second voltage signal from the second voltage signal terminal VGH to the third node N3 under the control of the voltage at the first node N1.

For example, as shown in FIG. 7, the first pull-up sub-circuit includes a fourth transistor T4. A control electrode of the fourth transistor T4 is coupled to the first node N1, a first electrode of the fourth transistor T4 is coupled to the second voltage signal terminal VGH, and a second electrode of the fourth transistor T4 is coupled to the third node N3.

Therefore, in the charging phase S1, the second input sub-circuit 2 is turned on under the control of the first clock signal Ck1 from the first clock signal terminal CK1 to transmit the first voltage signal from the first voltage signal terminal VGL to the second node N2, so that the voltage at the second node N2 is lowered; the first transistor T1 in the first pull-down sub-circuit 31 is turned on under the control of the voltage at the second node N2 to transmit the second clock signal Ck2 (non-operating voltage) from the second clock signal terminal CK2 to the fifth node N5; the third transistor(s) T3 in the pull-up control subs-circuit 32 are turned off under the control of the voltage at the fifth node N5, and the first node N1 receives the input signal Input (non-operating voltage) from the signal input terminal INPUT; the fourth transistor T4 in the first pull-up sub-circuit 33 is turned off under the control of the voltage at the first node N1, so that the third node N3 is in a floating state, which is convenient to pull down the voltage at the third node N3 to the operating voltage in the output phase S2.

In the output phase S2, the first transistor T1 in the first pull-down sub-circuit 31 is turned on under the control of the voltage at the second node N2 to transmit the second clock signal Ck2 (operating voltage) from the second clock signal terminal CK2 to the third Node N3 and fifth node N5; the third transistor(s) T3 in the pull-up control sub-circuit 32 are turned on under the control of the voltage at the fifth node N5 to transmit the second voltage signal from the second voltage signal terminal VGH to the first node N1, so as to ensure that the fourth transistor T4 in the first pull-up sub-circuit 33 always keeps to be turned off in the output phase S2, and thus ensure that the voltage at the third node N3 is stabilized at the operating voltage. As a result, the output sub-circuit 6 continuously transmits the second voltage signal from the second voltage signal terminal VGH to the signal output terminal OUTPUT, which may improve the display stability.

Figure 8:
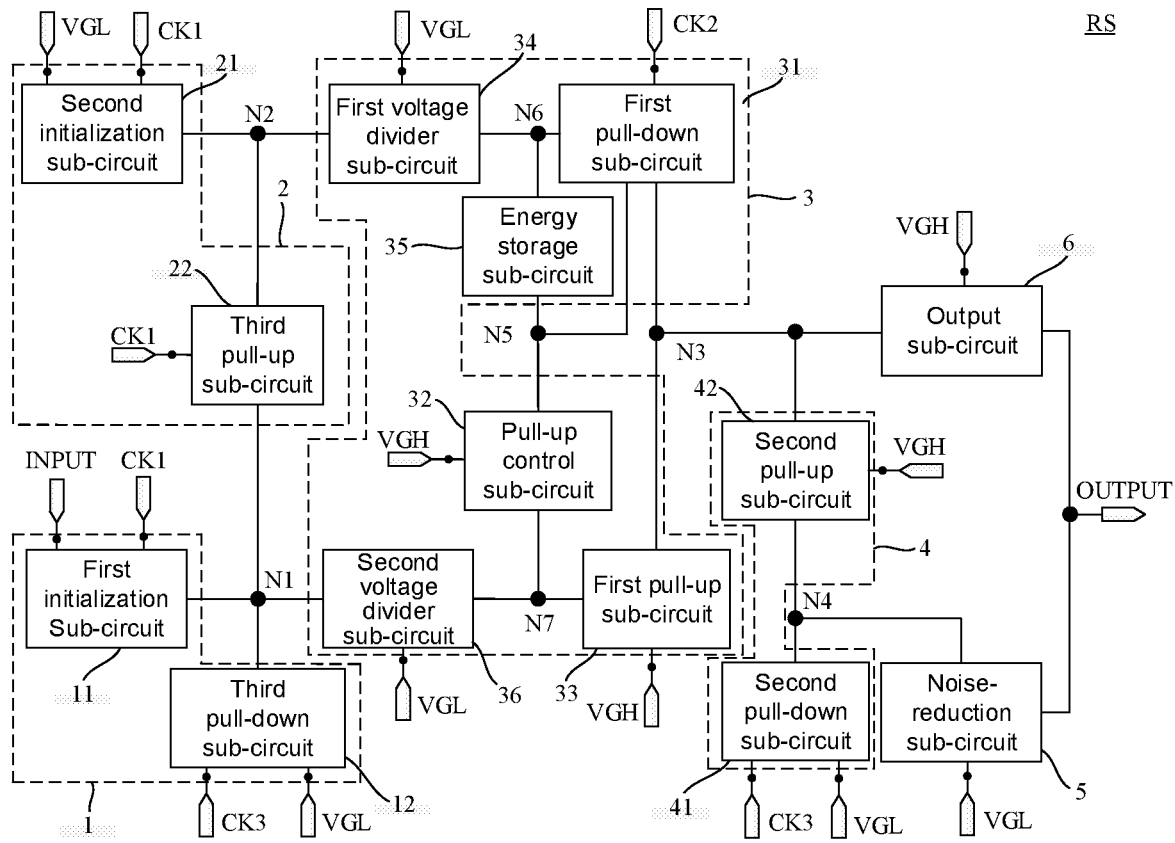
FIG. 8 is a block diagram showing a circuit structure of yet another shift register, in accordance with some embodiments.

In some other embodiments, as shown in FIGS. 5 and 8, the first control sub-circuit 3 includes a first voltage divider sub-circuit 34, an energy storage sub-circuit 35, a first pull-down sub-circuit 31, a second voltage divider sub-circuit 36, a pull-up control sub-circuit 32 and a first pull-up control sub-circuit 33.

The first voltage divider sub-circuit 34 is coupled to the first voltage signal terminal VGL, the second node N2 and a sixth node N6, and the first voltage divider sub-circuit 34 is configured to transmit the voltage at the second node N2 to the sixth node N6 under control of the first voltage signal from the first voltage signal terminal VGL. Here, the first voltage divider sub-circuit 34 is used to isolate the second node N2 and the sixth node N6, which is beneficial to keep the voltage at the sixth node N6 stable.

Figure 9:
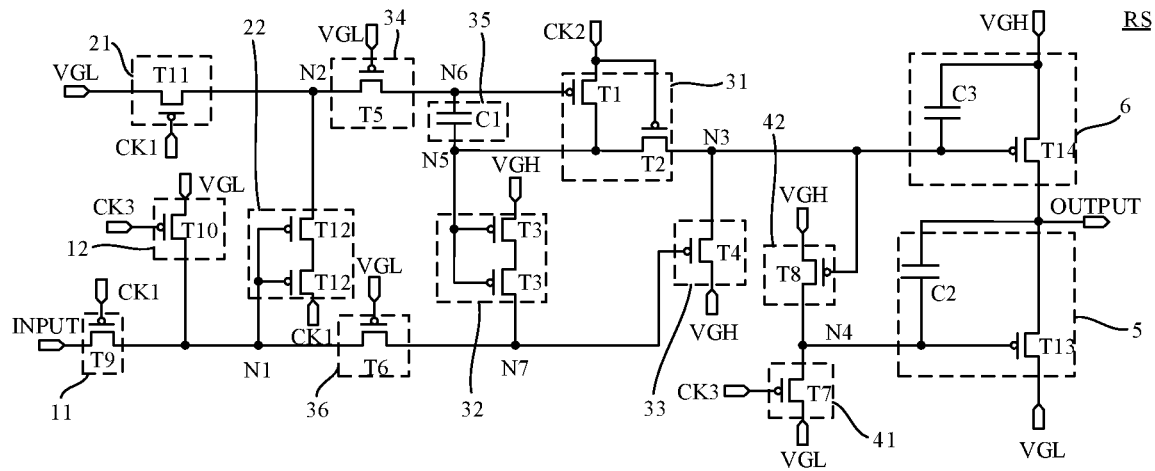
FIG. 9 is a circuit diagram of another shift register, in accordance with some embodiments.

For example, as shown in FIG. 9, the first voltage divider sub-circuit 34 includes a fifth transistor T5. A control electrode of the fifth transistor T5 is coupled to the first voltage signal terminal VGL, a first electrode of the fifth transistor T5 is coupled to the second node N2, and a second electrode of the fifth transistor T5 is coupled to the sixth node N6.

The energy storage sub-circuit 35 is coupled to the fifth node N5 and the sixth node N6, and the energy storage sub-circuit 35 is configured to keep the voltages of the fifth node N5 and the sixth node N6. Herein, the energy storage sub-circuit 35 is used to store and maintain the voltages of the fifth node N5 and the sixth node N6, which is beneficial to keep the voltages of the fifth node N5 and the sixth node N6 stable.

For example, as shown in FIG. 9, the energy storage sub-circuit 35 includes a first capacitor C1. A first terminal of the first capacitor C1 is coupled to the sixth node N6, and a second terminal of the first capacitor C1 is coupled to the fifth node N5.

The first pull-down sub-circuit 31 is coupled to the second clock signal terminal CK2, the fifth node N5, the sixth node N6 and the third node N3, and the first pull-down sub-circuit 31 is configured to transmit the second clock signal Ck2 from the second clock signal terminal CK2 to the fifth node N5 or to both the fifth node N5 and the third node N3 under control of the voltage at the sixth node N6.

For example, as shown in FIG. 9, the first pull-down sub-circuit 31 includes a first transistor T1 and a second transistor T2. A control electrode of the first transistor T1 is coupled to the sixth node N6, a first electrode of the first transistor T1 is coupled to the second clock signal terminal CK2, and a second electrode of the first transistor T1 is coupled to the fifth node N5. A control electrode of the second transistor T2 is coupled to the second clock signal terminal CK2, a first electrode of the second transistor T2 is coupled to the fifth node N5, and a second electrode of the second transistor T2 is coupled to the third node N3.

The second voltage divider sub-circuit 36 is coupled to the first voltage signal terminal VGL, the first node N1 and a seventh node, and the second voltage divider sub-circuit 36 is configured to transmit the voltage at the first node N1 to the seventh node N7 under the control of the first voltage signal from the first voltage signal terminal VGL. Here, the second voltage divider sub-circuit 36 is used to isolate the first node N1 and the seventh node N7, which is beneficial to keep the voltage at the seventh node N7 stable.

For example, as shown in FIG. 9, the second voltage divider sub-circuit 36 includes a sixth transistor T6. A control electrode of the sixth transistor T6 is coupled to the first voltage signal terminal VGL, a first electrode of the sixth transistor T6 is coupled to the first node N1, and a second electrode of the sixth transistor T6 is coupled to the seventh node N7.

The pull-up control sub-circuit 32 is coupled to the second voltage signal terminal VGH, the fifth node N5 and the seventh node N7, and the pull-up control sub-circuit 32 is configured to transmit the second voltage signal from the second voltage signal terminal VGH to the seventh node N7 under control of the voltage at the fifth node N5.

For example, the pull-up control sub-circuit 32 includes third transistor(s) T3. Control electrodes of the third transistor(s) T3 are coupled to the fifth node N5, a first electrode of the third transistor(s) T3 is coupled to the second voltage signal terminal VGH, and a second electrode of the third transistor(s) T3 is coupled to the seventh node N7.

It will be noted that, the pull-up control sub-circuit 32 may include at least two third transistors T3 that are connected in series in sequence. Control electrodes of all third transistors T3 in the at least two third transistors T3 are coupled to the fifth node N5, a first electrode of the first third transistor T3 in the at least two third transistors T3 is coupled to the second voltage signal terminal VGH, and a second electrode of the last third transistor T3 in the at least two third transistors T3 is coupled to the seventh node N7. Here, by using the at least two third transistors T3 that are connected in series in sequence, it may be possible to effectively prevent the voltage at the seventh node N7 from fluctuating due to the electric leakage of the third transistor T3, which is beneficial to keep the voltage at the seventh node N7 stable.

For example, as shown in FIG. 9, there are two third transistors T3 that are connected in series in sequence. Control electrodes of the two third transistors T3 are both coupled to the fifth node N5, a first electrode of the first third transistor T3 is coupled to the second voltage signal terminal VGH, and a second electrode of the second third transistor T3 is coupled to the seventh node N7.

The first pull-up sub-circuit 33 is coupled to the second voltage signal terminal VGH, the third node N3 and the seventh node N7, and the first pull-up sub-circuit 33 is configured to transmit the second voltage signal from the second voltage signal terminal VGH to the third node N3 under control of the voltage at the seventh node N7.

For example, as shown in FIG. 9, the first pull-up sub-circuit 33 includes a fourth transistor T4. A control electrode of the fourth transistor T4 is coupled to the seventh node N7, a first electrode of the fourth transistor T4 is coupled to the second voltage signal terminal VGH, and a second electrode of the fourth transistor T4 is coupled to the third node N3.

Therefore, in the charging phase S1, the second input sub-circuit 2 is turned on under the control of the first clock signal Ck1 from the first clock signal terminal CK1 to transmit the first voltage signal from the first voltage signal terminal VGL to the second node N2; the voltage at the second node N2 is transmitted to the sixth node N6 through the first voltage divider sub-circuit 34; the first transistor T1 in the first pull-down sub-circuit 31 is turned on under the control of the voltage at the sixth node N6 to transmit the second clock signal Ck2 (non-operating voltage) from the second clock signal terminal CK2 to the fifth node N5; the third transistor(s) T3 in the pull-up control sub-circuit 32 are turned off under the control of the voltage at the fifth node N5, and the seventh node N7 receives the input signal Input (non-operating voltage) from the signal input terminal INPUT; the fourth transistor T4 in the first pull-up sub-circuit 33 is turned off under the control of the voltage at the seventh node N7, so that the third node N3 is in a floating state, which is convenient to pull down the voltage at the third node N3 to the operating voltage in the output phase S2.

In the output phase S2, the sixth node N6 is kept stable due to the action of the energy storage sub-circuit 35; the first transistor T1 in the first pull-down sub-circuit 31 is turned on under the control of the voltage at the sixth node N6 to transmit the second clock signal Ck2 (operating voltage) from the second clock signal terminal CK2 to the third node N3 and the fifth node N5; the third transistor(s) T3 in the pull-up control sub-circuit 32 are turned on under the control of the voltage at the fifth node N5 to transmit the second voltage signal from the second voltage signal terminal VGH to the seventh node N7, so as to ensure that the fourth transistor T4 in the first pull-up sub-circuit 33 always keeps to be turned off in the output phase S2, and thus ensure that the voltage at the third node N3 is stabilized at the operating voltage. As a result, the output sub-circuit 6 continuously transmits the second voltage signal from the second voltage signal terminal VGH to the signal output terminal OUTPUT, which may improve the display stability.

In some embodiments, as shown in FIGS. 6 and 8, the second control sub-circuit 4 includes a second pull-down sub-circuit 41 and a second pull-up sub-circuit 42.

The second pull-down sub-circuit 41 is coupled to the first voltage signal terminal VGL, the third clock signal terminal CK3 and the fourth node N4, and the second pull-down sub-circuit 41 is configured to transmit the first voltage signal from the first voltage signal terminal VGL to the fourth node N4 under the control of the third clock signal Ck3 from the third clock signal terminal CK3, so as to turn on the noise reduction sub-circuit 5.

For example, as shown in FIGS. 7 and 9, the second pull-down cub-circuit 41 includes a seventh transistor T7. A control electrode of the seventh transistor T7 is coupled to the third clock signal CK3, a first electrode of the seventh transistor T7 is coupled to the first voltage signal terminal VGL, and a second electrode of the seventh transistor T7 is coupled to the fourth node N4.

The second pull-up sub-circuit 42 is coupled to the second voltage signal terminal VGH, the third node N3 and the fourth node N4, and the second pull-up sub-circuit 42 is configured to transmit the second voltage signal from the second voltage signal terminal VGH to the fourth node N4 under the control of the voltage at the third node N3, so as to turn off the noise reduction sub-circuit 5.

For example, as shown in FIGS. 7 and 9, the second pull-up sub-circuit 42 includes an eighth transistor T8. A control electrode of the eighth transistor T8 is coupled to the third node N3, a first electrode of the eighth transistor T8 is coupled to the second voltage signal terminal VGH, and a second electrode of the eighth transistor T8 is coupled to the fourth node N4.

Therefore, in the charging phase S1, the third node N3 is in a floating state, and the voltage at the third node N3 is the second voltage signal from the second voltage signal terminal VGH transmitted by the first control sub-circuit 3 in the previous frame, and belongs to the non-operating voltage; the output sub-circuit 6 is turned off under the control of the voltage at the third node N3; the eighth transistor T8 in the second pull-up sub-circuit 42 is turned off under the control of the voltage at the third node N3; the seventh transistor T7 in the second pull-down sub-circuit 42 is turned off under the control of the third clock signal Ck3 (non-operating voltage) from the third clock signal terminal CK3, so that the fourth node N4 is in a floating state, and the voltage at the fourth node N4 is the first voltage signal input when the seventh transistor T7 in the second pull-down sub-circuit 41 is turned on in the previous frame, and belongs to the operating voltage; and the noise reduction sub-circuit 5 continues to be turned on under the control of the fourth node N4.

In the output phase S2, the voltage at the third node N3 is the operating voltage, and the output sub-circuit 6 is turned on under the control of the voltage at the third node N3 to output the scanning signal; the seventh transistor T7 in the second pull-down sub-circuit 41 is turned off under the control of the third clock signal Ck3 (non-operating voltage) from the third clock signal terminal CK3; the eighth transistor T8 in the second pull-up sub-circuit 42 is turned on under the control of the voltage at the third node N3 to transmit the second voltage signal from the second voltage signal terminals VGH to the fourth node N4; the noise reduction sub-circuit 5 is turned off under control of the fourth node N4, so as to ensure that the signal output terminal OUTPUT continuously outputs a stable scanning signal.

In some embodiments, as shown in FIGS. 6 and 8, the first input sub-circuit 1 includes a first initialization sub-circuit 11 and a third pull-down sub-circuit 12.

The first initialization sub-circuit 11 is coupled to the first clock signal terminal CK1, the signal input terminal INPUT and the first node N1, and the first initialization sub-circuit 11 is configured to transmit the input signal Input from the signal input terminal INPUT to the first node N1 under the control of the first clock signal Ck1 from the first clock signal terminal CK1.

For example, as shown in FIGS. 7 and 9, the first initialization sub-circuit 11 includes a ninth transistor T9. A control electrode of the ninth transistor T9 is coupled to the first clock signal terminal CK1, a first electrode of the ninth transistor T9 is coupled to the signal input terminal INPUT, and a second electrode of the ninth transistor T9 is coupled to the first node N1.

The third pull-down sub-circuit 12 is coupled to the first voltage signal terminal VGL, the third clock signal terminal CK3 and the first node N1, and the third pull-down sub-circuit 12 is configured to transmit the first voltage signal from the first voltage signal terminal VGL to the first node N1 under the control of the third clock signal Ck3 from the third clock signal terminal CK3.

For example, as shown in FIGS. 7 and 9, the third pull-down sub-circuit 12 includes a tenth transistor T10. A control electrode of the tenth transistor T10 is coupled to the third clock signal terminal CK3, a first electrode of the tenth transistor T10 is coupled to the first voltage signal terminal VGL, and a second electrode of the tenth transistor T10 is coupled to the first node N1.

It will be seen from the above that, the first initialization sub-circuit 11 and the third pull-down sub-circuit 12 are controlled by different clock signals. In this way, the first initialization sub-circuit 11 and the third pull-down sub-circuit 12 may be independently controlled at different phases.

For example, before the first initialization sub-circuit 11 transmits the input signal Input from the signal input terminal INPUT to the first node N1, the first voltage signal from the first voltage signal terminal VGL is transmitted to the first node N1 through the third pull-down sub-circuit 12 to pull down the voltage at the first node N1, which may facilitate the continuous and stable transmission of the input signal Input from the signal input terminal Input to the first node N1 in the charging phase S2.

In some embodiments, as shown in FIGS. 6 and 8, the second input sub-circuit 2 includes a second initialization sub-circuit 21 and a third pull-up sub-circuit 22.

The second initialization sub-circuit 21 is coupled to the first clock signal terminal CK1, the first voltage signal terminal VGL and the second node N2, and the second initialization sub-circuit 21 is configured to transmit the first voltage signal from the first voltage signal terminal VGL to the second node N2 under the control of the first clock signal Ck1 from the first clock signal terminal CK1.

For example, as shown in FIGS. 7 and 9, the second initialization sub-circuit 21 includes an eleventh transistor T11. A control electrode of the eleventh transistor T11 is coupled to the first clock signal terminal CK1, a first electrode of the eleventh transistor T11 is coupled to the first voltage signal terminal VGL, and a second electrode of the eleventh transistor T11 is coupled to the second node N2.

The third pull-up sub-circuit 22 is coupled to the first clock signal terminal CK1, the first node N1 and the second node N2, and the third pull-up sub-circuit 22 is configured to transmit the first clock signal Ck1 from the first clock signal terminal CK1 to the second node N2 under the control of the voltage at the first node N1.

For example, the third pull-up sub-circuit 22 includes twelfth transistor(s) T12. Control electrode of the twelfth transistor(s) T12 are coupled to the first node N1, a first electrode of the twelfth transistor(s) T12 is coupled to the first clock signal terminal CK1, and a second electrode of the twelfth transistor(s) T12 is coupled to the second node N2.

It will be noted that, the third pull-up sub-circuit 22 may include at least two twelfth transistors T12 that are connected in series in sequence. Control electrodes of all the twelfth transistors T12 in the at least two twelfth transistors T12 are coupled to the first node N1, a first electrode of the first twelfth transistor T12 in the at least two twelfth transistors T12 is coupled to the first clock signal terminal CK1, and a second electrode of the last twelfth transistor T12 in the at least two twelfth transistors T12 is coupled to the second node N2. Here, by using the at least two twelfth transistors T12 that are connected in series in sequence, it may be possible to effectively prevent the voltage at the second node N2 from fluctuating due to the electric leakage of the twelfth transistor T12, which is beneficial to keep the voltage at the second node N2 stable.

For example, as shown in FIGS. 7 and 9, there are two twelfth transistors T12. Control electrodes of the two twelfth transistors T12 are both coupled to the first node N1, the two twelfth transistors T12 are connected in series in sequence, a first electrode of the first twelfth transistor T12 is coupled to the first clock signal terminal CK1, and a second electrode of the second twelfth transistor T12 is coupled to the second node N2.

It can be seen from the above, the second initialization sub-circuit 21 and the third pull-up sub-circuit 22 may control the voltage (operating voltage or non-operating voltage) input to the second node N2 in different phases.

For example, when the signal input terminal INPUT continuously outputs the operating voltage (except for the frame where the output phase S2 is located), and the second clock signal Ck2 output by the second clock signal terminal CK2 is the operating voltage, the voltage at the second node N2 is the first clock signal Ck1 (non-operating voltage) transmitted by the third pull-up sub-circuit 22; and in the output phase S2, the second node N2 is in a floating state, and the voltage at the second node N2 is the first voltage signal transmitted by the second initialization sub-circuit 21.

In some embodiments, as shown in FIGS. 7 and 9, the noise reduction sub-circuit 5 includes a second capacitor C2 and a thirteenth transistor T13. A first terminal of the second capacitor C2 is coupled to the fourth node N4, and a second terminal of the second capacitor C2 is coupled to signal input terminal OUTPUT. A control electrode of the thirteenth transistor T13 is coupled to the fourth node N4, a first electrode of the thirteenth transistor T13 is coupled to the first voltage signal terminal VGL, and a second electrode of the thirteenth transistor T13 is coupled to the signal output terminal OUTPUT.

Figure 10:
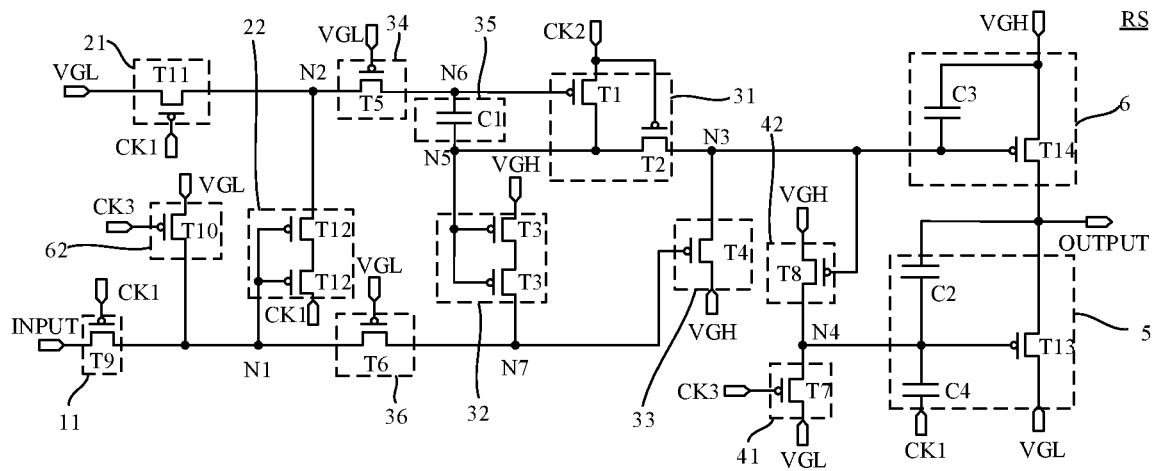
FIG. 10 is a circuit diagram of yet another shift register, in accordance with some embodiments.

Based on this, as shown in FIG. 10, the noise reduction sub-circuit 5 is further coupled to the first clock signal terminal CK1, and the noise reduction sub-circuit 5 further includes a fourth capacitor C4. A first terminal of the fourth capacitor C4 is coupled to the first clock signal terminal CK1, and a second terminal of the fourth capacitor C4 is coupled to the fourth node N4.

In this case, the first terminal of the fourth capacitor C4 is connected to the first clock signal terminal CK1, so that the fourth capacitor C4 may not only stabilize the voltage at the fourth node N4, but also further adjust the voltage at the fourth node N4 when the first clock signal Ck1 from the first clock signal terminal CK1 changes, which may cause the voltage at the fourth node N4 to be quickly stabilized at a voltage that can cause the noise reduction sub-circuit 5 to be turned on. As a result, it is beneficial to improving the noise reduction rate of the noise reduction sub-circuit 5.

For example, in a case where the voltage of the first clock signal Ck1 from the first clock signal terminal CK1 decreases, the fourth capacitor C4 may further pull down the voltage of the fourth node N4, which is beneficial to improve the noise reduction rate of the noise reduction sub-circuit 5.

In some embodiments, as shown in FIGS. 7 and 9, the output sub-circuit 6 includes a third capacitor C3 and a fourteenth transistor T14. A first terminal of the third capacitor C3 is coupled to the second voltage signal terminal VGH, and a second terminal of the third capacitor C3 is coupled to the third node N3. A control electrode of the fourteenth transistor T14 is coupled to the third node N3, a first electrode of the fourteenth transistor T14 is coupled to the second voltage signal terminal VGH, and a second electrode of the fourteenth transistor T14 is coupled to the signal output terminal OUTPUT.

Some embodiments of the present disclosure further provide a driving method for a shift register RS, and the driving method is applied to the shift register RS according to any of the above embodiments. As shown in FIG. 12, a single frame period F includes a charging phase S1 and an output phase S2. The driving method includes the following steps.

In the charging phase S1, the first input sub-circuit 1 transmits the input signal from the signal input terminal INPUT to the first node N1 under control of an operating voltage of the first clock signal Ck1 from the first clock signal terminal CK1; the second input sub-circuit 2 transmits the first voltage signal from the first voltage signal terminal VGL to the second node N2 under the control of the operating voltage of the first clock signal Ck1 from the first clock signal terminal CK1; and the first control sub-circuit 3 writes and stores the voltage at the second node N2.

In the output phase S2, the first control sub-circuit 3 transmits an operating voltage of the second clock signal Ck2 from the second clock signal terminal CK2 to the third node N3 under the control of the voltage at the second node N2; the output sub-circuit 6 transmits the second voltage signal from the second voltage signal terminal VGH to the signal output terminal OUTPUT under the control of the voltage at the third node N3; the second control sub-circuit 4 transmits the second voltage signal from the second voltage signal terminal VGH to the fourth node N4 under the control of the voltage at the third node N3; and the noise reduction sub-circuit 5 is turned off under the control of the voltage at the fourth node N4.

In some embodiments, the single frame period further includes a noise-reduction phase S3, and the driving method further includes the following steps.

In the noise-reduction phase S3, the first input sub-circuit 1 transmits the first voltage signal from the first voltage signal terminal VGL to the first node N1 under control of an operating voltage of the third clock signal Ck3 from the third clock signal terminal CK3; the second input sub-circuit 2 transmits a non-operating voltage of the first clock signal Ck1 from the first clock signal terminal CK1 to the second node N2 under control of the voltage at the first node N1; the first control sub-circuit 3 transmits the second voltage signal from the second voltage signal terminal VGH to the third node N3 under control of the voltage at the first node N1 and the voltage at the second node N2; the output sub-circuit 6 is turned off under control of the voltage at the third node N3; the second control sub-circuit 4 transmits the first voltage signal from the first voltage signal terminal VGL to the fourth node N4 under the control of the operating voltage of the third clock signal Ck3 from the third clock signal terminal CK3; and the noise reduction sub-circuit 5 is turned on under the control of the voltage at the fourth node N4.

An operation process of the shift register RS in a driving process of a gate line will be described in detail below in conjunction with FIG. 10. The following description will be made by considering an example in which all the transistors in the shift register RS are P-type transistors (without considering influence of threshold voltage of the transistor), the voltage transmitted by the first voltage signal terminal VGL is the operating voltage, and the voltage transmitted by the second voltage signal terminal VGH is the non-operating voltage.

"The operating voltage" is a low voltage which can cause the operated transistor included in the shift register to be turned on; and "the non-operating voltage" is a high voltage which cannot cause the operated transistor included in the shift register to be turned on (i.e., the transistor being turned off).

For example, in the following descriptions, "0" represents the low voltage, and "1" represents the high voltage.

In the charging phase S1, referring to FIGS. 10 and 12, Input=1, Ck1=0, Ck2=1, Ck3=1.

In this case, the ninth transistor T9 is turned on under control of the operating voltage of the first clock signal terminal CK1, the tenth transistor T10 is turned off under control of the non-operating voltage of the third clock signal terminal CK3, and the non-operating voltage of the signal input terminal INPUT is transmitted to the first node N1 and the seventh node N7, so that the voltage at the first node N1 and the voltage at the seventh node N7 are high voltages.

The twelfth transistors T12 are turned off under control of the high voltage at the first node N1, the eleventh transistor T11 is turned on under control of the operating voltage of the first clock signal terminal CK1, and the first voltage signal from the first voltage signal terminal VGL is transmitted to the second node N2 and the sixth node N6, so that the voltage at the second node N2 and the voltage at the sixth node N6 are low voltages.

The first transistor T1 is turned on under control of the low voltage at the sixth node N6, the non-operating voltage of the second clock signal terminal CK2 is transmitted to the fifth node N5, and the voltage at the fifth node N5 is a high voltage. The third transistors T3 are turned off under control of the high voltage at the fifth node N5.

The fourth transistor T4 is turned off under control of the high voltage at the seventh node N7, and the second transistor T2 is turned off under control of the non-operating voltage of the second clock signal terminal CK2, so that the third node N3 is in a floating state. Since the signal input terminal INPUT always transmits the operating voltage in a previous frame, the voltage at the first node N1 and the voltage at the seventh node N7 are low voltages. Therefore, in the previous frame, the fourth transistor T4 is turned on under control of the low voltage at the seventh node N7, and the second voltage signal from the second voltage signal terminal VGH is transmitted to the third node N3, so that the voltage at the third node N3 is a high voltage. Based on this, in the charging phase S1, the voltage at the third node N3 is still the high voltage.

The eighth transistor T8 is turned off under control of the high voltage at the third node N3, and the seventh transistor T7 is turned off under control of the non-operating voltage of the third clock signal terminal CK3, so that the fourth node N4 is in a floating state. Since the third node N3 is always at the high voltage from the previous frame to the end of the charging phase, the voltage at the fourth node N4 is the operating voltage of the first voltage signal from the first voltage signal terminal VGL transmitted to the fourth node N4 when the third clock signal terminal CK3 is at the operating voltage in the previous frame, and the voltage at the fourth node N4 is a low voltage.

In this case, the fourteenth transistor T14 is turned off under control of the high voltage at the third node N3, and the thirteenth transistor T13 is turned on under control of the low voltage at the fourth node N4, so that the first voltage signal from the first voltage signal terminal VGL is transmitted to the signal output terminal OUTPUT, so as to ensure continuous noise-reduction on the signal output terminal OUTPUT.

In the output phase S2, referring to FIGS. 10 and 12, Input=0, Ck1=1, Ck2=0, Ck3=1.

In this case, the ninth transistor T9 is turned off under control of the non-operating voltage of the first clock signal terminal CK1, the tenth transistor T10 is turned off under control of the non-operating voltage of the third clock signal terminal CK3. The first node N1 and the seventh node N7 are each in a floating state, the voltage at the first node N1 and the voltage at the seventh node N7 are both the non-operating voltages in the charging phase S2, and are both high voltages.

The twelfth transistors T12 are turned off under control of the high voltage at the first node N1, and the eleventh transistor T11 is turned off under control of the non-operating voltage of the first clock signal terminal CK1. The second node N2 and the sixth node N6 are each in a floating state, the voltage at the second node N2 and the voltage at the sixth node N6 are both the operating voltages in the charging phase S1, and are both low voltages.

The first transistor T1 is turned on under control of the low voltage at the sixth node N6, the operating voltage of the second clock signal terminal CK2 is transmitted to the fifth node N5, and the voltage at the fifth node N5 is a low voltage. The third transistors T3 are turned on under control of the low voltage at the fifth node N5, so as to ensure that the seventh node N7 is continuously stabilized at the high voltage.

The fourth transistor T4 is turned off under control of the high voltage at the seventh node N7, the second transistor T2 is turned on under control of the operating voltage of the second clock signal terminal CK2, so that the operating voltage of the second clock signal terminal CK2 is transmitted to the third node N3, and the voltage at the third node N3 is stabilized at the low voltage.

The seventh transistor T7 is turned off under control of the non-operating voltage of the third clock signal terminal CK3, the eighth transistor T8 is turned on under control of the low voltage at the third node N3 to transmit the second voltage signal from the second voltage signal terminal VGH to the fourth node N4, and the voltage at the fourth node N4 is a high voltage.

In this case, the thirteenth transistor T13 is turned off under control of the high voltage at the fourth node N4, and the fourteenth transistor T14 is turned on under control of the low voltage at the third node N3 to transmit the second voltage signal from the second voltage signal terminal VGH to the signal output terminal OUTPUT, so as to output the scanning signal.

In the noise-reduction phase S3, referring to FIGS. 10 and 12, Input=0, Ck1=1, Ck2=1, Ck3=0.

In this case, the ninth transistor T9 is turned off under control of the non-operating voltage of the first clock signal terminal CK1, the tenth transistor T10 is turned on under control of the operating voltage of the third clock signal terminal CK3, the first voltage signal from the first voltage signal terminal VGL is transmitted to the first node N1 and the seventh node N7, and the voltage at the first node N1 and the voltage at the seventh node N7 are both low voltages.

The eleventh transistor T11 is turned off under control of the non-operating voltage of the first clock signal terminal CK1, the twelfth transistors T12 are turned on under control of the low voltage at the first node N1, the non-operating voltage of the first clock signal terminal CK1 is transmitted to the second node N2 and the sixth node N6, and the voltage at the second node N2 and the voltage at the sixth node N6 are both high voltages.

The first transistor T1 is turned off under control of the high voltage at the sixth node N6, and the voltage at the fifth node N5 is a high voltage due to the action of the first capacitor C1. The third transistors T3 are turned off under control of the high voltage at the fifth node N5, so as to ensure that the seventh node N7 is stabilized at the low voltage.

The fourth transistor T4 is turned on under control of the low voltage at the seventh node N7, the second transistor T2 is turned off under control of the non-operating voltage of the second clock signal terminal CK2, the second voltage signal from the second voltage signal terminal VGH is transmitted to the third node N3, and the voltage at the third node N3 is a high voltage.

The eighth transistor T8 is turned off under control of the high voltage at the third node N3, and the seventh transistor T7 is turned on under control of the low voltage of the third clock signal terminal CK3 to transmit the first voltage signal from the first voltage signal terminal VGL to the fourth node N4, so that the voltage at the fourth node N4 is a low voltage.

In this case, the fourteenth transistor T14 is turned off under control of the high voltage at the third node N3, and the thirteenth transistor T13 is turned on under control of the low voltage at the fourth node N4, so that the first voltage signal from the first voltage signal terminal VGL is transmitted to the signal output terminal OUTPUT, so as to perform the noise-reduction processing on the signal output terminal OUTPUT.

Figure 11:
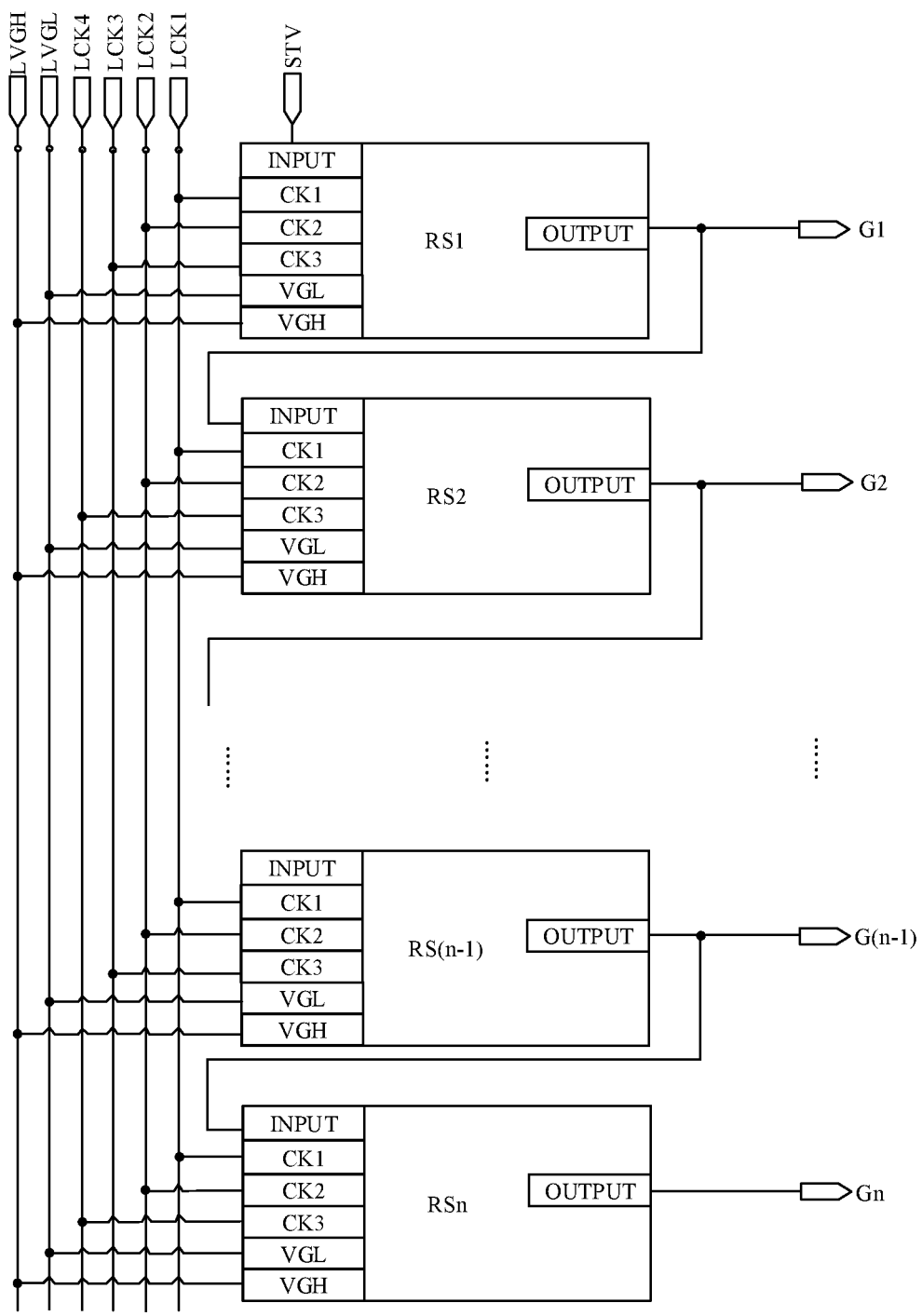
FIG. 11 is a structural diagram of a gate driver circuit, in accordance with some embodiments.

Some embodiments of the present disclosure further provide a gate driver circuit 200. As shown in FIG. 11, the gate driver circuit 200 includes at least two shift registers RS that are cascaded.

In some embodiments, in every two adjacent shift registers RS, a signal input terminal INPUT of a latter-stage shift register RS is coupled to a signal output terminal OUTPUT of a former-stage shift register RS, and a signal input terminal INPUT of the first-stage shift register RS1 is coupled to an initialization signal terminal STV.

In some embodiments, the gate driver circuit 200 further includes a first clock signal line LCK1, a second clock signal line LCK2, a third clock signal line LCK3 and a fourth clock signal line LCK4. The first clock signal line LCK1 is coupled to the first clock signal terminal CK1 of each shift register RS, the second clock signal line LCK2 is coupled to the second clock signal terminal CK2 of each shift register RS, the third clock signal line LCK3 is coupled to third clock signal terminals CK3 of odd-numbered stage shift registers RS, and the fourth clock signal line LCK4 is coupled to third clock signal terminals CK3 of even-numbered stage shift registers RS.

As shown in FIG. 12, N-CK3 is a square wave pulse signal of the third clock signal terminal CK3 of the next-stage shift register RS. A rising edge of N-CK3 is aligned with a rising edge of an output signal of the signal output terminal OUTPUT of a previous-stage shift register RS. For example, CK3 is a square wave pulse signal provided by the third clock signal line LCK3 coupled to the odd-numbered stage shift registers RS, and N-CK3 is a square wave pulse signal provided by the fourth clock signal line LCK4 coupled to the even-numbered stage shift registers RS.

In addition, the gate driver circuit 200 in some embodiments of the present disclosure further includes a first voltage signal line LVGL and a second voltage signal line LVGH. The first voltage signal line LVGL is coupled to a first voltage signal terminal VGL of each shift register RS, and the second voltage signal line LVGH is coupled to a second voltage signal terminal VGH of each shift register RS.

In the embodiments of the present disclosure, the cascade manner of the stages shift registers RS in the gate driver circuit 200 and the connection manner between the stages shift registers RS and the clock signal lines in the gate driver circuit 200 are not limited thereto.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:
1. A shift register, comprising:
   a first input sub-circuit coupled to a first clock signal terminal, a signal input terminal and a first node; the first input sub-circuit being configured to transmit an input signal from the signal input terminal to the first node under control of a first clock signal from the first clock signal terminal;
   a second input sub-circuit coupled to the first clock signal terminal, a first voltage signal terminal and a second node; the second input sub-circuit being configured to transmit a first voltage signal from the first voltage signal terminal to the second node under control of the first clock signal from the first clock signal terminal;
   a first control sub-circuit coupled to a second clock signal terminal, the second node and a third node; the first control sub-circuit being configured to transmit a second clock signal from the second clock signal terminal to the third node under control of a voltage at the second node;
   a second control sub-circuit coupled to a third clock signal terminal, the first voltage signal terminal and a fourth node; the second control sub-circuit being configured to transmit the first voltage signal from the first voltage signal terminal to the fourth node under control of a third clock signal from the third clock signal terminal;
   a noise reduction sub-circuit coupled to the first voltage signal terminal, the fourth node and a signal output terminal; the noise reduction sub-circuit being configured to transmit the first voltage signal from the first voltage signal terminal to the signal output terminal under control of a voltage at the fourth node; and an output sub-circuit coupled to a second voltage signal terminal, the third node and the signal output terminal; the output sub-circuit being configured to transmit a second voltage signal from the second voltage signal terminal to the signal output terminal under control of a voltage at the third node.

2. The shift register according to claim 1, wherein the first input sub-circuit is further coupled to the third clock signal terminal and the first voltage signal terminal; the first input sub-circuit is further configured to transmit the first voltage signal from the first voltage signal terminal to the first node under control of the third clock signal from the third clock signal terminal;

the second input sub-circuit is further coupled to the first node; the second input sub-circuit is further configured to transmit the first clock signal from the first clock signal terminal to the second node under control of a voltage at the first node;

the first control sub-circuit is further coupled to the second voltage signal terminal and the first node; the first control sub-circuit is further configured to transmit the second voltage signal from the second voltage signal terminal to the third node under the control of the voltage at the first node; and the second control sub-circuit is further coupled to the second voltage signal terminal and the third node; the second control sub-circuit is further configured to transmit the second voltage signal from the second voltage signal terminal to the fourth node under the control of the voltage at the third node.

3. The shift register according to claim 2, wherein the first control sub-circuit includes:

a first pull-down sub-circuit coupled to the second clock signal terminal, the second node, the third node and a fifth node; the first pull-down sub-circuit being configured to transmit the second clock signal from the second clock signal terminal to the fifth node and the third node under the control of the voltage at the second node;

a pull-up control sub-circuit coupled to the second voltage signal terminal, the first node and the fifth node; the pull-up control sub-circuit being configured to transmit the second voltage signal from the second voltage signal terminal to the first node under control of a voltage at the fifth node; and a first pull-up sub-circuit coupled to the second voltage signal terminal, the first node and the third node; the first pull-up sub-circuit being configured to transmit the second voltage signal from the second voltage signal terminal to the third node under the control of the voltage at the first node.

4. The shift register according to claim 3, wherein the first pull-down sub-circuit includes:

a first transistor; a control electrode of the first transistor being coupled to the second node, a first electrode of the first transistor being coupled to the second clock signal terminal, and a second electrode of the first transistor being coupled to the fifth node; and a second transistor; a control electrode of the second transistor being coupled to the second clock signal terminal, a first electrode of the second transistor being coupled to fifth node, and a second electrode of the second transistor being coupled to the third node;

the pull-up control sub-circuit includes:

one third transistor; a control electrode of the third transistor being coupled to the fifth node, a first electrode of the third transistor being coupled to the second voltage signal terminal, and a second electrode of the third transistor being coupled to the first node; or at least two third transistors connected in series; control electrodes of all third transistors in the at least two third transistors connected in series being coupled to the fifth node, a first electrode of a first third transistor in the at least two third transistors connected in series being coupled to the second voltage signal terminal, and a second electrode of a last third transistor in the at least two third transistors connected in series being coupled to the first node; and the first pull-up sub-circuit includes:

a fourth transistor; a control electrode of the fourth transistor being coupled to the first node, a first electrode of the fourth transistor being coupled to the second voltage signal terminal, and a second electrode of the fourth transistor being coupled to the third node.

5. The shift register according to claim 2, wherein the first control sub-circuit includes:

a first voltage divider sub-circuit coupled to the first voltage signal terminal, the second node and a sixth node; the first voltage divider sub-circuit being configured to transmit the voltage at the second node to the sixth node under control of the first voltage signal from the first voltage signal terminal;

an energy storage sub-circuit coupled to a fifth node and the sixth node; the energy storage sub-circuit being configured to maintain a voltage at the fifth node and a voltage at the sixth node;

a first pull-down sub-circuit coupled to the second clock signal terminal, the fifth node, the sixth node and the third node; the first pull-down sub-circuit being configured to transmit the second clock signal from the second clock signal terminal to the fifth node and the third node under control of the voltage at the sixth node;

a second voltage divider sub-circuit coupled to the first voltage signal terminal, the first node and a seventh node; the second voltage divider sub-circuit being configured to transmit the voltage at the first node to the seventh node under the control of the first voltage signal from the first voltage signal terminal;

a pull-up control sub-circuit coupled to the second voltage signal terminal, the fifth node and the seventh node; the pull-up control sub-circuit being configured to transmit the second voltage signal from the second voltage signal terminal to the seventh node under control of the voltage at the fifth node; and a first pull-up sub-circuit coupled to the second voltage signal terminal, the third node and the seventh node; the first pull-up sub-circuit being configured to transmit the second voltage signal from the second voltage signal terminal to the third node under control of a voltage at the seventh node.

6. The shift register according to claim 5, wherein the first voltage divider sub-circuit includes:

a fifth transistor; a control electrode of the fifth transistor being coupled to the first voltage signal terminal, a first electrode of the fifth transistor being coupled to the second node, and a second electrode of the fifth transistor being coupled to the sixth node;

the energy storage sub-circuit includes:
> a first capacitor; a first terminal of the first capacitor being coupled to the sixth node, and a second terminal of the first capacitor being coupled to the fifth node;

the first pull-down sub-circuit includes:
> a first transistor; a control electrode of the first transistor being coupled to the sixth node, a first electrode of the first transistor being coupled to the second clock signal terminal, and a second electrode of the first transistor being coupled to the fifth node; and
>
> a second transistor; a control electrode of the second transistor being coupled to the second clock signal terminal, a first electrode of the second transistor being coupled to the fifth node, and a second electrode of the second transistor being coupled to the third node;

the second voltage divider sub-circuit includes:
> a sixth transistor; a control electrode of the sixth transistor being coupled to the first voltage signal terminal, a first electrode of the sixth transistor being coupled to the first node, and a second electrode of the sixth transistor being coupled to the seventh node;

the pull-up control sub-circuit includes:
> one third transistor; a control electrode of the third transistor being coupled to the fifth node, a first electrode of the third transistor being coupled to the second voltage signal terminal, and a second electrode of the third transistor being coupled to the seventh node; or
>
> at least two third transistors connected in series; control electrodes of all third transistors in the at least two third transistors connected in series being coupled to the fifth node, a first electrode of a first third transistor in the at least two third transistors connected in series being coupled to the second voltage signal terminal, and a second electrode of a last third transistor in the at least two third transistors connected in series being coupled to the seventh node; and the first pull-up sub-circuit includes:
> a fourth transistor; a control electrode of the fourth transistor being coupled to the seventh node, a first electrode of the fourth transistor being coupled to the second voltage signal terminal, and a second electrode of the fourth transistor being coupled to the third node.

7. The shift register according to claim 2, wherein the second control sub-circuit includes:
> a second pull-down sub-circuit coupled to the first voltage signal terminal, the third clock signal terminal and the fourth node; the second pull-down sub-circuit being configured to transmit the first voltage signal from the first voltage signal terminal to the fourth node to turn on the noise reduction sub-circuit under the control of the third clock signal from the third clock signal terminal; and
>
> a second pull-up sub-circuit coupled to the second voltage signal terminal, the third node and the fourth node; the second pull-up sub-circuit being configured to transmit the second voltage signal from the second voltage signal terminal to the fourth node to turn off the noise reduction sub-circuit under the control of the voltage at the third node.

8. The shift register according to claim 7, wherein the second pull-down sub-circuit includes:
> a seventh transistor; a control electrode of the seventh transistor being coupled to the third clock signal terminal, a first electrode of the seventh transistor being coupled to the first voltage signal terminal, and a second electrode of the seventh transistor being coupled to the fourth node; and the second pull-up sub-circuit includes:
> an eighth transistor; a control electrode of the eighth transistor being coupled to the third node, a first electrode of the eighth transistor being coupled to the second voltage signal terminal, and a second electrode of the eighth transistor being coupled to the fourth node.

9. The shift register according to claim 2, wherein the first input sub-circuit includes:
> a first initialization sub-circuit coupled to the first clock signal terminal, the signal input terminal and the first node; the first initialization sub-circuit being configured to transmit the input signal from the signal input terminal to the first node under the control of the first clock signal from the first clock signal terminal; and
>
> a third pull-down sub-circuit coupled to the first voltage signal terminal, the third clock signal terminal and the first node; the third pull-down sub-circuit being configured to transmit the first voltage signal from the first voltage signal terminal to the first node under the control of the third clock signal from the third clock signal terminal.

10. The shift register according to claim 9, wherein the first initialization sub-circuit includes:
> a ninth transistor; a control electrode of the ninth transistor being coupled to the first clock signal terminal, a first electrode of the ninth transistor being coupled to the signal input terminal, and a second electrode of the ninth transistor being coupled to the first node; and the third pull-down sub-circuit includes:
> a tenth transistor; a control electrode of the tenth transistor being coupled to the third clock signal terminal, a first electrode of the tenth transistor being coupled to the first voltage signal terminal, and a second electrode of the ninth transistor being coupled to the first node.

11. The shift register according to claim 2, wherein the second input sub-circuit includes:
> a second initialization sub-circuit coupled to the first clock signal terminal, the first voltage signal terminal and the second node; the second initialization sub-circuit being configured to transmit the first voltage signal from the first voltage signal terminal to the second node under the control of the first clock signal from the first clock signal terminal; and
>
> a third pull-up sub-circuit coupled to the first clock signal terminal, the first node and the second node; the third pull-up sub-circuit being configured to transmit the first clock signal from the first clock signal terminal to the second node under the control of the voltage at the first node.

12. The shift register according to claim 11, wherein the second initialization sub-circuit includes:
> an eleventh transistor; a control electrode of the eleventh transistor being coupled to the first clock signal terminal, a first electrode of the eleventh transistor being coupled to the first voltage signal terminal, and a second electrode of the eleventh transistor being coupled to the second node; and the third pull-up sub-circuit includes:
> one twelfth transistor; a control electrode of the twelfth transistor being coupled to the first node, a first electrode of the twelfth transistor being coupled to the first clock signal terminal, and a second electrode of the twelfth transistor being coupled to the second node; or
>
> at least two twelfth transistors connected in series; control electrodes of all twelfth transistors in the at least two twelfth transistors connected in series being coupled to the first node, a first electrode of a first twelfth transistor in the at least two twelfth transistors connected in series being coupled to the first clock signal terminal, and a second electrode of a last twelfth transistor in the at least two twelfth transistors connected in series being coupled to the second node.

13. The shift register according to claim 1, wherein the noise reduction sub-circuit includes:
a second capacitor; a first terminal of the second capacitor being coupled to the fourth node, and a second terminal of the second capacitor being coupled to the signal output terminal; and
a thirteenth transistor; a control electrode of the thirteenth transistor being coupled to the fourth node, a first electrode of the thirteenth transistor being coupled to the first voltage signal terminal, and a second electrode of the thirteenth transistor being coupled to the signal output terminal.

14. The shift register according to claim 13, wherein the noise reduction sub-circuit is further coupled to the first clock signal terminal, and the noise reduction sub-circuit further includes:
a fourth capacitor; a first terminal of the fourth capacitor being coupled to the first clock signal terminal, and a second terminal of the fourth capacitor being coupled to the fourth node.

15. The shift register according to claim 1, wherein the output sub-circuit includes:
a third capacitor; a first terminal of the third capacitor being coupled to the second voltage signal terminal, and a second terminal of the third capacitor being coupled to the third node; and
a fourteenth transistor; a control electrode of the fourteenth transistor being coupled to the third node, a first electrode of the fourteenth transistor being coupled to the second voltage signal terminal, and a second electrode of the fourteenth transistor being coupled to the signal output terminal.

16. A gate driver circuit, comprising at least two shift registers that are cascaded and each according to claim 1.

17. The gate driver circuit according to claim 16, wherein in every two adjacent shift registers, a signal input terminal of a latter-stage shift register is coupled to a signal output terminal of a former-stage shift register; and another signal input terminal of a first-stage shift register is coupled to an initialization signal terminal;
the gate driver circuit further comprises:
a first clock signal line coupled to a first clock signal terminal of each shift register;
a second clock signal line coupled to a second clock signal terminal of each shift register;
a third clock signal line coupled to third clock signal terminals of odd-numbered stage shift registers; and
a fourth clock signal line coupled to third clock signal terminals of even-numbered stage shift registers.

18. A display apparatus, comprising the gate driver circuit according to claim 16.

19. A driving method for a shift register, applied to the shift register according to claim 1, a single frame period including a charging phase and an output phase, and the driving method comprising:
in the charging phase:
the first input sub-circuit transmitting the input signal from the signal input terminal to the first node under control of an operating voltage of the first clock signal from the first clock signal terminal; and
the second input sub-circuit transmitting the first voltage signal from the first voltage signal terminal to the second node under the control of the operating voltage of the first clock signal from the first clock signal terminal; and
in the output phase:
the first control sub-circuit transmitting an operating voltage of the second clock signal from the second clock signal terminal to the third node under the control of the voltage at the second node; and
the output sub-circuit transmitting the second voltage signal from the second voltage signal terminal to the signal output terminal under the control of the voltage at the third node, wherein the noise reduction sub-circuit is turned off.

20. The driving method according to claim 19, wherein the first input sub-circuit is further coupled to the third clock signal terminal and the first voltage signal terminal, and the first input sub-circuit is further configured to transmit the first voltage signal from the first voltage signal terminal to the first node under control of the third clock signal from the third clock signal terminal; the second input sub-circuit is further coupled to the first node, and the second input sub-circuit is further configured to transmit the first clock signal from the first clock signal terminal to the second node under control of a voltage at the first node; the first control sub-circuit is further coupled to the second voltage signal terminal and the first node, and the first control sub-circuit is further configured to transmit the second voltage signal from the second voltage signal terminal to the third node under the control of the voltage at the first node; and the second control sub-circuit is further coupled to the second voltage signal terminal and the third node, and the second control sub-circuit is further configured to transmit the second voltage signal from the second voltage signal terminal to the fourth node under the control of the voltage at the third node;
in the output phase, the noise reduction sub-circuit being turned off includes:
the second control sub-circuit transmitting the second voltage signal from the second voltage signal terminal to the fourth node under the control of the voltage at the third node; and
the noise reduction sub-circuit being turned off under the control of the voltage at the fourth node;
the single frame period further includes a noise-reduction phase, and the driving method further comprises:
in the noise-reduction phase:
the first input sub-circuit transmitting the first voltage signal from the first voltage signal terminal to the first node under control of an operating voltage of the third clock signal from the third clock signal terminal;
the second input sub-circuit transmitting a non-operating voltage of the first clock signal from the first clock signal terminal to the second node under control of the voltage at the first node;
the first control sub-circuit transmitting the second voltage signal from the second voltage signal terminal to the third node under the control of the voltage at the first node;
the output sub-circuit being turned off under the control of the voltage at the third node;
the second control sub-circuit transmitting the first voltage signal from the first voltage signal terminal to the fourth node under the control of the operating voltage of the third clock signal from the third clock signal terminal; and the noise reduction sub-circuit being turned on under the control of the voltage at the fourth node.

* * * * *